(12) United States Patent
Ipposhi

(10) Patent No.: US 7,553,741 B2
(45) Date of Patent: Jun. 30, 2009

(54) MANUFACTURING METHOD OF SEMICONDUCTOR DEVICE

(75) Inventor: Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 302 days.

(21) Appl. No.: 11/381,657

(22) Filed: May 4, 2006

(65) Prior Publication Data
US 2006/0270121 A1    Nov. 30, 2006

(30) Foreign Application Priority Data
May 13, 2005    (JP)    ............................. 2005-140824

(51) Int. Cl.
*H01L 21/76* (2006.01)
(52) U.S. Cl. .................. 438/425; 438/218; 438/219; 438/221; 438/424; 438/426; 438/427; 438/435; 438/444; 438/445; 438/405
(58) Field of Classification Search .............. 438/218, 438/219, 221, 405, 424–427, 435, 444–445
See application file for complete search history.

(56) References Cited

U.S. PATENT DOCUMENTS

| | | | |
|---|---|---|---|
| 6,225,148 B1 | 5/2001 | Miyamoto et al. | |
| 6,495,898 B1 * | 12/2002 | Iwamatsu et al. | ........... 257/506 |
| 6,875,663 B2 | 4/2005 | Iwamatsu et al. | |
| 6,958,266 B2 | 10/2005 | Yamaguchi et al. | |
| 7,008,834 B2 * | 3/2006 | Nakai et al. | .................. 438/197 |
| 2001/0031518 A1 * | 10/2001 | Kim et al. | .................... 438/149 |
| 2003/0153136 A1 * | 8/2003 | Matsumoto et al. | .......... 438/151 |

OTHER PUBLICATIONS

S. Maeda, et al., "Impact of 0.18 μm SOI CMOS Technology using Hybrid Trench Isolation with High Resistivity Substrate on Embedded RF/Analog Application", Symposium on VLSI Technology Digest of Technical Papers, 2000, pp. 154-155.
Y. Hirano, et al., "Bulk-Layout-Compatible 0.18 μm SOI-CMOS Technology Using Body-Fixed Partial Trench Isolation (PTI)", 1999 IEEE International SOI Conference, Oct. 1999, pp. 131-132.

* cited by examiner

*Primary Examiner*—Kevin M Picardat
*Assistant Examiner*—Bac H Au
(74) *Attorney, Agent, or Firm*—Oblon, Spivak, McClelland, Maier & Neustadt, P.C.

(57) ABSTRACT

Even if the insulated isolation structure which makes element isolation using partial and full isolation combined use technology is manufactured, the manufacturing method of a semiconductor device which can manufacture the semiconductor device with which characteristics good as a semiconductor element formed in the SOI layer where insulated isolation was made are obtained is obtained.

Etching to an inner wall oxide film and an SOI layer is performed by using as a mask the resist and trench mask which were patterned, and the trench for full isolation which penetrates an SOI layer and reaches an embedded insulating layer is formed. Although a part of CVD oxide films with which the resist is not formed in the upper part are removed at this time, since a silicon nitride film is protected by the CVD oxide film, the thickness of a silicon nitride film is kept constant. Then, after removing the resist and depositing an isolation oxide film on the whole surface, an isolation oxide film is flattened in good thickness precision in the height specified by the thickness of a silicon nitride film by performing CMP treatment which used the silicon nitride film as the polishing stopper.

6 Claims, 23 Drawing Sheets

F I G . 1 3
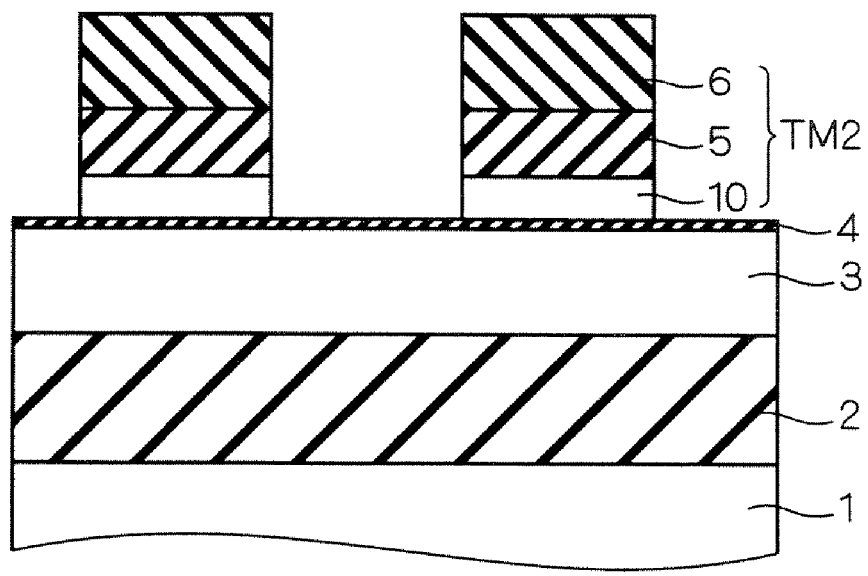
F I G . 1 4
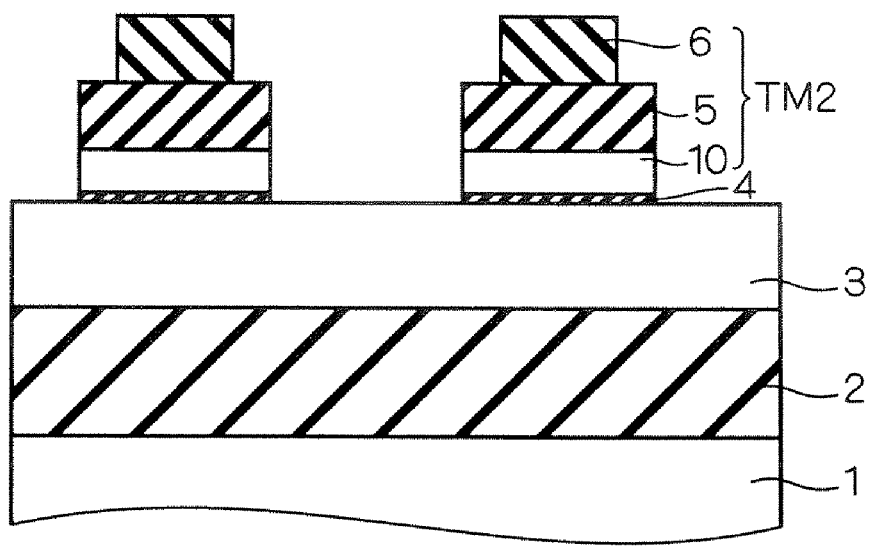

F I G . 4 1
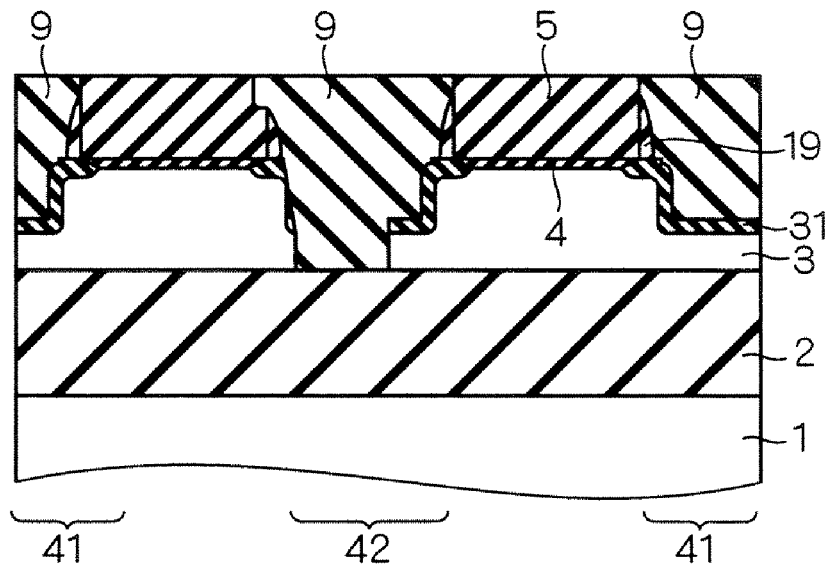
F I G . 4 2
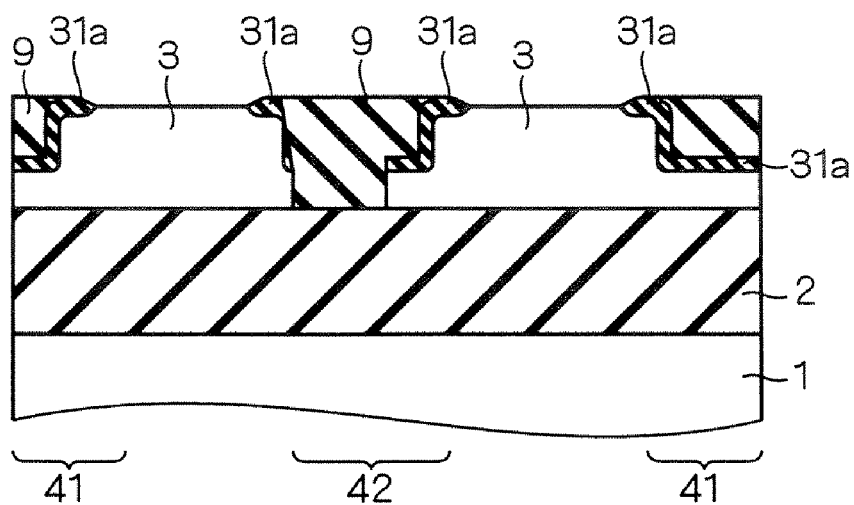

MANUFACTURING METHOD OF SEMICONDUCTOR DEVICE

CROSS-REFERENCE TO RELATED APPLICATION

The present application claims priority from Japanese patent application No. 2005-140824 filed on May 13, 2005, the content of which is hereby incorporated by reference into this application.

1. Field of the Invention

This invention relates to a manufacturing method of a semiconductor device of SOI structure.

2. Description of the Background Art

The semiconductor device called an SOI (Silicon-On-Insulator) device attracts attention as a high speed and a low consumption device these days.

This SOI device is made in the SOI substrate of SOI structure which sandwiched a buried oxide film between an SOI layer and a silicon substrate. Conventionally, full isolation of the SOI element (an (semiconductor) element formed in the SOI layer of SOI structure, such as a transistor) was made with the oxide film for isolation which penetrates Si (silicon) of the SOI layer and is formed to the buried oxide film.

Since the element is electrically thoroughly insulated from another elements, this full isolation technology has the features, like being a latch-up free (a latch-up not happening) and it is strong in a noise. However, since the transistor operated in the electrically floating state, there was a problem that a frequency dependency will occur in delay time, or the substrate floating effect of the kink effect that a hump occurs in a drain current-drain voltage characteristic etc. will occur. In order to suppress this substrate floating effect, the partial isolation (Partial Trench Isolation (PTI)) technology which can fix substrate potential (body electric potential) via the SOI layer under a partial oxidation film by forming an isolation oxide film (partial oxidation film) in an upper layer part so that a buried oxide film may not be touched, forming a partial isolation region with a part of SOI layer of a lower layer part, and forming a body terminal in the body region formed in the region where element isolation was made by the partial isolation region, is effective. There is nonpatent literature 1 as a literature which disclosed this partial isolation technology.

However, with partial isolation technology, there was a problem of losing a merit called the latch-up free which was a merit of full isolation technology with this partial isolation technology. Then, the partial isolation and full isolation combined use (Hybrid Trench Isolation) technology which puts together and has a merit of both partial isolation technology and full isolation technology was developed. Nonpatent literature 2 is mentioned as a literature which disclosed this partial and full isolation combined use technology.

[Nonpatent literature 1] Y. Hirano et. al, "Bulk-Layout-Compatible 0.18 µm SOI-CMOS Technology Using Body-Fixed Partial Trench Isolation (PTI), 1999 IEEE International SOI Confernce", October 1999, p. 131-132

[Nonpatent literature 2] S. Maeda et. al, "Impact of 0.18 µm SOI CMOS Technology using Hybrid Trench Isolation with High Resistivity Substrate on Embedded RF/Analog Applicaion" 2000 Symposium on VLSI Technology Digest of Technical Papers, p. 154-155

SUMMARY OF THE INVENTION

However, when the semiconductor device of SOI structure is manufactured using partial and full isolation combined use technology, there was a problem that the characteristics of semiconductor elements, such as a transistor formed in an SOI layer, will get worse under the effect of the variation generated in the thickness of (partial, full) isolation insulating layers, such as an isolation oxide film, the steep degree of the edge part of the SOI layer where insulated isolation was made, etc.

This invention was made in order to solve the above-mentioned problem. This invention aims at obtaining a manufacturing method of a semiconductor device which can manufacture the semiconductor device with which characteristics good as a semiconductor element formed in the SOI layer where insulated isolation was made are obtained even if the insulated isolation structure which makes element isolation using partial and full isolation combined use technology is manufactured.

A manufacturing method of a semiconductor device according to claim 1 concerning this invention comprises the steps of: (a) forming an underlay insulating layer over an SOI layer of an SOI substrate which includes a laminated structure of a semiconductor substrate, an embedded insulating layer, and the SOI layer, and forming a trench mask over the underlay insulating layer, wherein the trench mask includes a first mask layer, and a second mask layer formed over the first mask layer; (b) forming a first trench of a predetermined number by removing the underlay insulating layer, and a part of upper layer portions of the SOI layer by using the trench mask as a mask; (c) forming at least one second trench that reaches the embedded insulating layer by penetrating the SOI layer of lower part of at least one of the first trenches of the predetermined number by using the trench mask and a patterned resist as a mask; (d) removing the second mask layer while making flattening of an insulating layer for isolation by a thickness specified by a thickness of the first mask layer by performing CMP treatment by using the first mask layer as a polishing stopper after embedding the insulating layer for isolation in the first and the second trench after removing the resist; and (e) removing the first mask layer after removing a part of the insulating layer for isolation so that a formation height of the insulating layer for isolation may become comparable as a height of the SOI layer.

As for the manufacturing method of the semiconductor device according to claim 1 in this invention, since the upper layer of the first mask layer used as a polishing stopper is protected by the second mask layer at the time of formation of the second trench of the step (c), the uniformity of the thickness of the first mask layer is maintained in the execution time of the step (c).

Therefore, since flattening can be made by the CMP treatment which is performed at the step (d) and which used the first mask layer as the polishing stopper, maintaining the uniformity of the insulating layer for isolation, the partial and full isolation combined use isolation structure which includes a partial isolation region obtained by the insulating layer for isolation embedded in the first trench and a full isolation region obtained by the insulating layer for isolation embedded in the first and the second trenches can be acquired with sufficient accuracy after the step (e) execution.

As a result, the effect that characteristics good as a semiconductor element formed in the SOI layer in which insulated isolation was made by the above-mentioned partial and full isolation combined use isolation structure can be obtained is acquired.

BRIEF DESCRIPTION OF THE DRAWINGS

FIGS. 13 to 18 are sectional views showing the manufacturing method of the semiconductor device which is Embodiment 3;

FIGS. 37 to 42 are sectional views showing the manufacturing method of the semiconductor device which is Embodiment 8.

DETAILED DESCRIPTION OF THE PREFERRED EMBODIMENTS

Embodiment 1

(Details of Manufacturing Method)

FIG. 1-FIG. 6 are the sectional views showing the manufacturing method of the semiconductor device which has the insulated isolation structure of partial and full isolation combined use which is Embodiment 1 of this invention. Hereafter, the manufacturing method of Embodiment 1 is explained with reference to these drawings.

Figure 1:
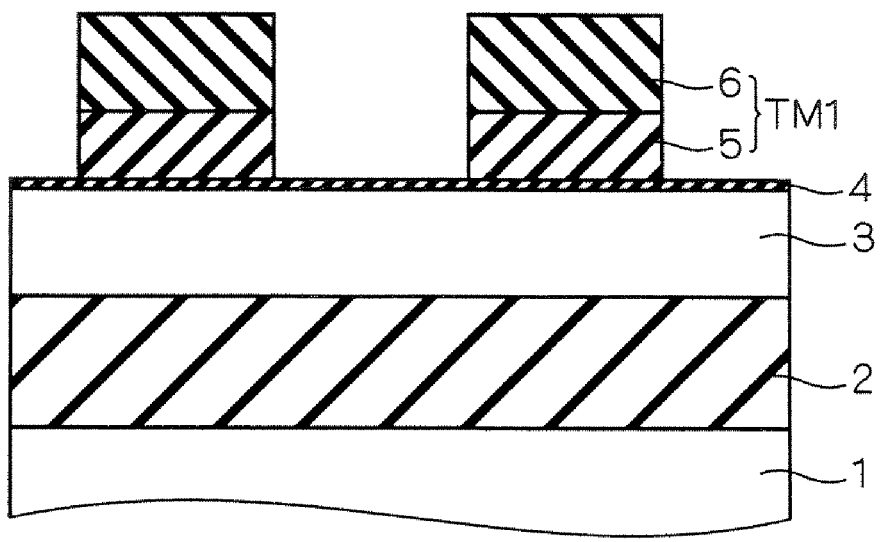
FIGS. 1 to 6 are sectional views showing the manufacturing method of the semiconductor device which is Embodiment 1.

First, as shown in FIG. 1, silicon oxide layer 4 which turns into an underlay oxide film is formed all over SOI layer 3 upper part of the SOI substrate which is formed in order of semiconductor substrate 1, embedded insulating layer 2, and SOI layer 3, and includes these semiconductor substrates 1, embedded insulating layer 2, and SOI layer 3. Further, silicon nitride film 5 (first mask layer) and CVD (Chemical Vapor Deposition) oxide film 6 (second mask layer) are formed on the whole surface one by one. Then, patterning is performed using a photoengraving process etc. to silicon nitride film 5 and CVD oxide film 6, and trench mask TM1 of two layer structure including silicon nitride film 5 and CVD oxide film 6 which were patterned is obtained.

About 80 nm can be considered as thickness of SOI layer 3, and about 10 nm can be considered as thickness of silicon oxide layer 4. About 70 nm can be considered as thickness of silicon nitride film 5, and about 70 nm can be considered as thickness of CVD oxide films 6, such as a TEOS (tetraethyl orthosilicate) film. However, as for silicon oxide layer 4, some upper layer portions are removed at the time of trench mask TM1 formation.

Figure 2:
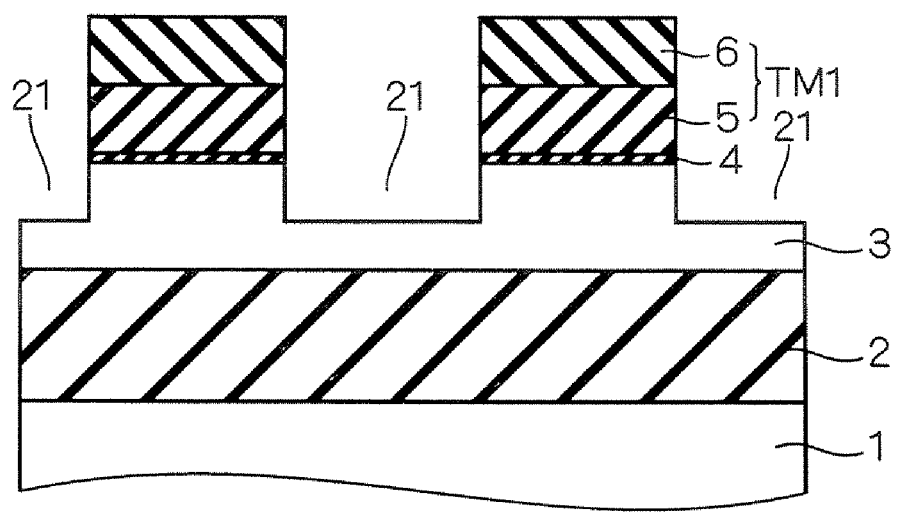

Then, as shown in FIG. 2, the first dry etching to silicon oxide layer 4 and the second dry etching to the upper layer portion of SOI layer 3 are performed by using trench mask TM1 as a mask, respectively, and trench 21 (first trench) for isolation of a predetermined number is formed. In the second dry etching, about 47 nm of SOI layers 3 are removed, for example. In the case of removal of silicon oxide layer 4 by the first dry etching, a part of upper layer portions of CVD oxide film 6 are removed, and it is set to about 50 nm.

Figure 3:
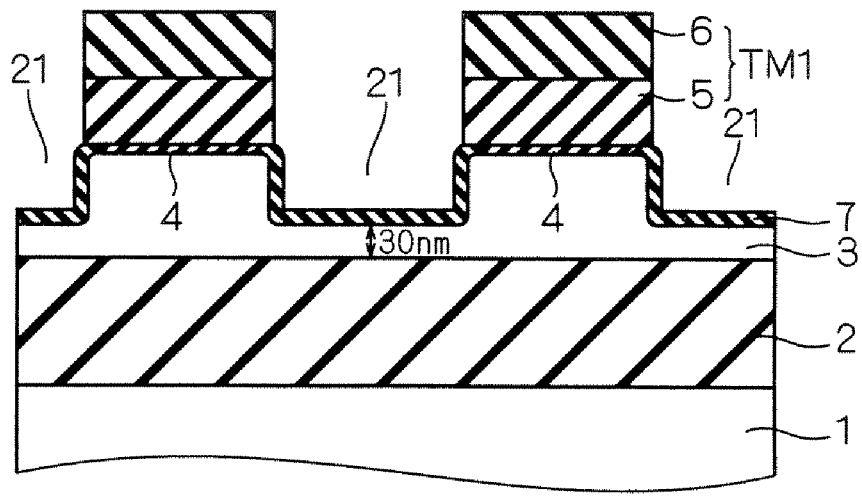

And as shown in FIG. 3, inner wall oxide film 7 of about 15 nm thickness is formed in the exposed surface of SOI layer 3 by thermal oxidation process, for example. As a result, the thickness of SOI layer 3 under trench 21 for isolation is set to about 30 nm.

Figure 4:
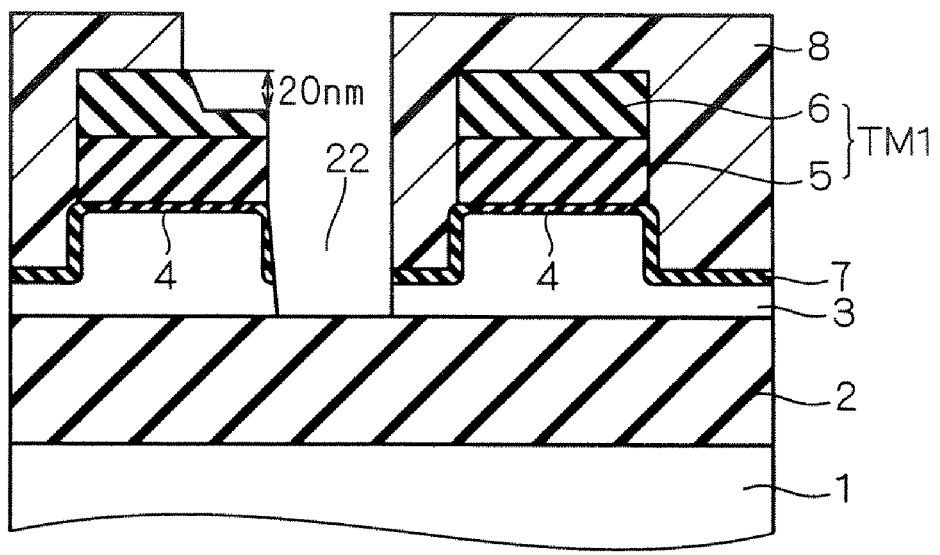

Next, by performing etching to inner wall oxide film 7 and SOI layer 3 by using resist 8 patterned as a mask and trench mask TM1, penetrating SOI layer 3, and reaching embedded insulating layer 2, as shown in FIG. 4, trench 22 (second trench) for full isolation to which the surface of embedded insulating layer 2 was exposed is formed selectively. Thus, SOI layer 3 of the lower part of at least one trench 21 for isolation among trenches 21 for isolation of a predetermined number is penetrated, and trench 22 for full isolation is obtained.

At this time, although a part of CVD oxide films 6 on which resist 8 is not formed in the upper part is removed (removed by depth of about 20 nm in the example of FIG. 4), since silicon nitride film 5 under CVD oxide film 6 is not removed, the thickness of silicon nitride film 5 is kept constant. When specifying the formation position of trench 22 for full isolation with the edge of trench mask TM1 of CVD oxide film 6 and silicon nitride film 5, resist 8 is not formed on a part of CVD oxide films 6, as shown in FIG. 4.

Figure 5:
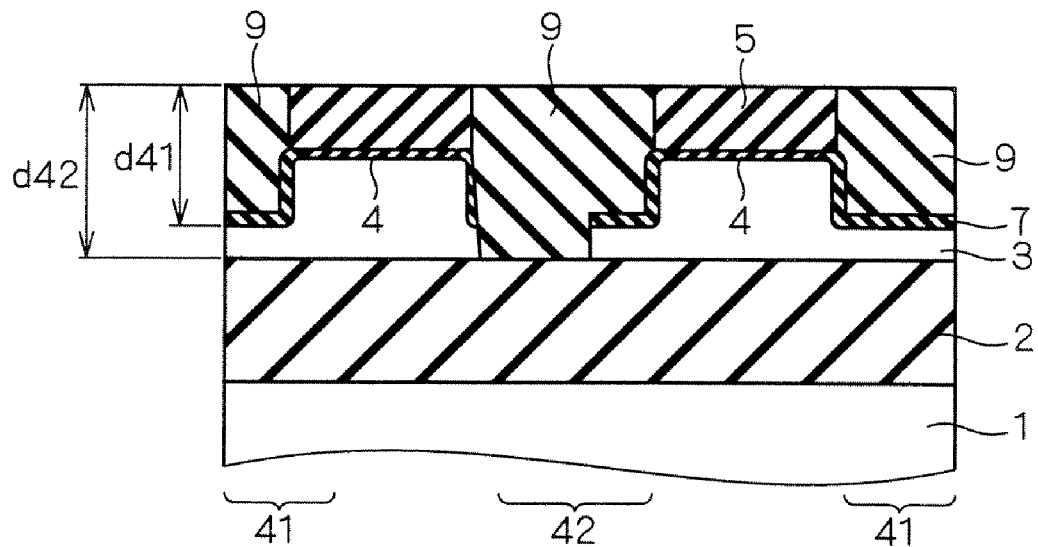

Then, as shown in FIG. 5, after removing resist 8 and depositing isolation oxide film 9 on the whole surface, by performing the CMP (Chemical Mechanical Polishing) process (process which uses silicon nitride film 5 as a polishing stopper, and makes over-polishing a little correctly) which used silicon nitride film 5 as the polishing stopper, flattening of the isolation oxide film 9 is made in the height specified by the thickness of silicon nitride film 5. Since the thickness of silicon nitride film 5 is kept uniform at this time, it works effectively as a polishing stopper. Therefore, isolation oxide film 9 is flattened with good thickness precision.

Since CVD oxide film 6 on silicon nitride film 5 has almost the same grinding rate as isolation oxide film 9, all are removed at the time of CMP treatment. As a result, as for isolation oxide film 9, thickness is kept uniform. That is, the thickness of isolation oxide film 9 in partial isolation region 41 is kept uniform by isolation oxide film thickness d41, and the thickness of isolation oxide film 9 in full isolation region 42 is kept uniform by isolation oxide film thickness d42.

Figure 6:
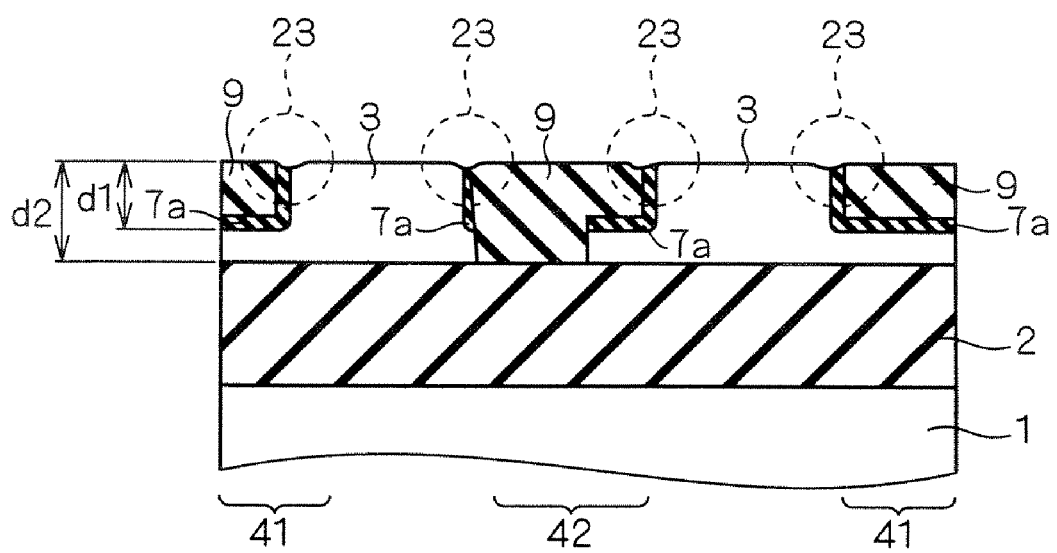

Then, after performing oxide film etching by fluoric acid in order to adjust the level difference of isolation oxide film 9 and the surface of SOI layer 3 as shown in FIG. 6, silicon nitride film 5 is removed and the insulated isolation structure which makes element isolation using partial and full isolation combined use technology is completed. In the above-mentioned insulated isolation structure, while the thickness of isolation oxide film 9 in partial isolation region 41 is kept uniform by isolation oxide film thickness d1, and the thickness of isolation oxide film 9 in full isolation region 42 is kept uniform by isolation oxide film thickness d2, residual oxide film 7a of inner wall oxide film 7 remains under the bottom face of isolation oxide film 9 in partial isolation region 41, and between isolation oxide film 9 and SOI layer 3 in partial isolation region 41 and full isolation region 42,.

Effect of Embodiment 1

Figure 43:
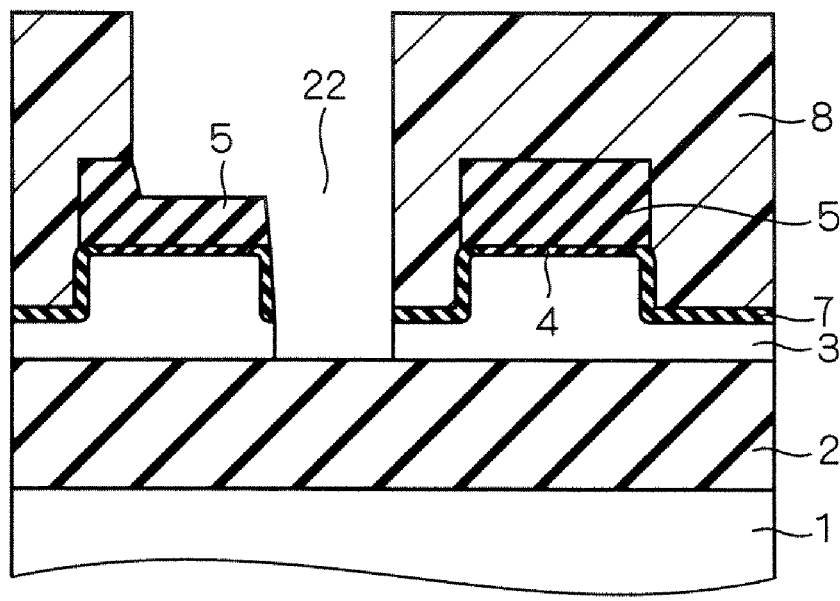
FIG. 43 to 45 are sectional views showing the manufacturing method for a comparison for the purpose of effect explanation of Embodiment 1.
Figure 44:
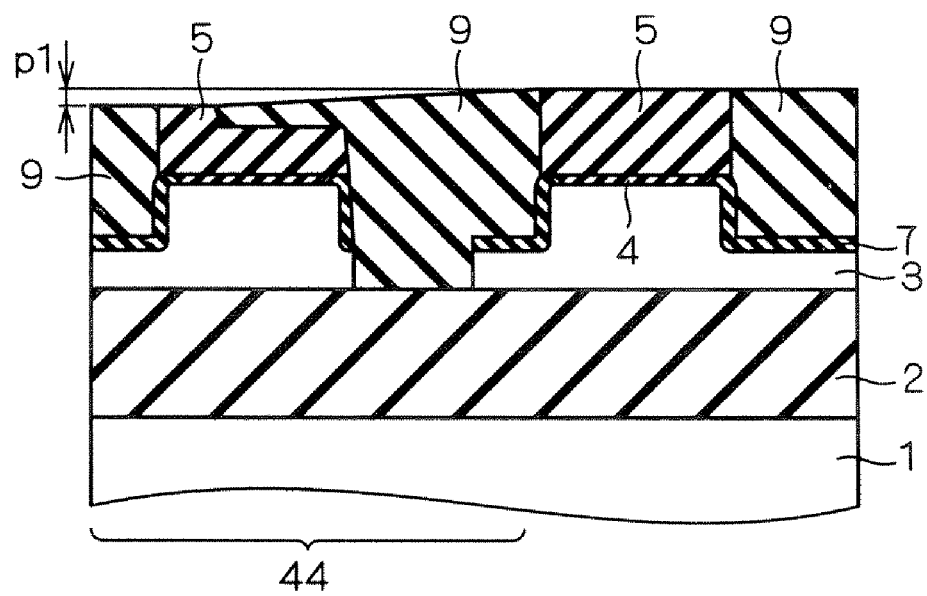
Figure 45:
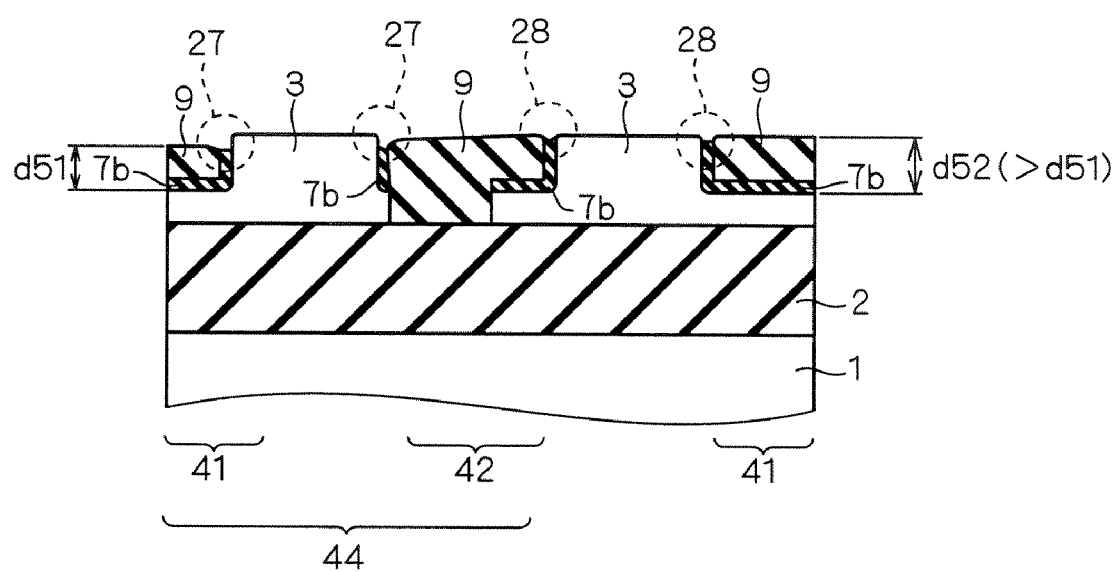

FIG. 43-FIG. 45 are the sectional views showing a part of manufacturing method of the semiconductor device which has the insulated isolation structure of the conventional partial and full isolation combined use for the comparison with Embodiment 1. FIG. 43-FIG. 45 correspond to the step shown by the FIG. 4-FIG. 6 of Embodiment 1.

It was common to use only silicon nitride film 5 as a trench mask conventionally. Therefore, except for the point that CVD oxide film 6 is not formed on silicon nitride film 5, it will pass through the same steps as the steps shown by the FIG. 1-FIG. 3 of Embodiment 1 until the step which forms inner wall oxide film 7 (the steps shown by the FIG. 1-FIG. 3 of Embodiment 1).

Then, as shown in FIG. 43, etching to inner wall oxide film 7 and SOI layer 3 is performed by using as a mask resist 8 and silicon nitride film 5 which were patterned, and trench 22 for full isolation to which the surface of embedded insulating layer 2 was exposed is formed. At this time, a part of silicon nitride films 5 where resist 8 is not formed in the upper part are removed, and the uniformity of thickness is lost.

Then, as shown in FIG. 44, after removing resist 8 and depositing isolation oxide film 9 on the whole surface, flattening of the isolation oxide film 9 is made in the height specified by the thickness of silicon nitride film 5 by performing CMP treatment which used silicon nitride film 5 as the polishing stopper. Since it is assuming the cross-section shape from which a part of silicon nitride films 5 were removed at this time, as a result of forming over-polishing region 44 which made maximum the amount p1 of over-polishing, the uniformity of the thickness of isolation oxide film 9 is hampered.

Then, as shown in FIG. 45, after performing oxide film etching which adjusts the level difference of isolation oxide film 9, and the surface of SOI layer 3, silicon nitride film 5 is removed. As a result, while the thickness of isolation oxide film 9 of partial isolation region 41 in over-polishing region 44 is isolation oxide film thickness d51, the thickness of isolation oxide film 9 in partial isolation region 41 out of over-polishing region 44 turns into isolation oxide film thickness d52 (>d51), and uniformity is hampered. SOI layer end portion neighboring region 27 in over-polishing region 44 will differ in the shape of isolation oxide film 9 of the edge part of SOI layer 3 from SOI layer end portion neighboring region 28 outside over-polishing region 44. Thus, when non-uniformity occurred in the thickness and shape of isolation oxide film 9 and a transistor is formed in SOI layer 3, it will have the trouble that variation will occur in transistor characteristics.

Since the edge part of SOI layer 3 between isolation oxide films 9 and 9 is thoroughly exposed in over-polishing region 44, when MOSFET which makes channel width the width of the horizontal direction of SOI layer 3 shown by FIG. 45 is formed, the parasitic MOSFET phenomenon of bringing about lowering of the threshold voltage of a transistor locally by gate electric field concentration generates at the edge part of SOI layer 3. When such a parasitic MOSFET phenomenon occurs, the controllability of the threshold voltage of a transistor will be degraded by a narrow channel effect with the variation in MOS transistor characteristics.

On the other hand, according to the manufacturing method of the semiconductor device of Embodiment 1, even after the formation of trench 22 for full isolation, the thickness of silicon nitride film 5 is uniform by existence of CVD oxide film 6 which protects silicon nitride film 5. Therefore, over-polishing region 44 as shown in FIG. 44 does not generate, and as mentioned above, the thickness and shape of isolation oxide film 9 which are formed eventually can be kept uniform. Therefore, even if it forms MOSFET which makes channel width the width of the horizontal direction of SOI layer 3 shown by FIG. 6, the above-mentioned parasitic MOSFET phenomenon and the above-mentioned narrow channel effect cannot be generated, and the variation in transistor characteristics can be decreased substantially.

Since residual oxide film 7a is formed even in about the same height as the formation height of SOI layer 3 in SOI layer end portion neighboring region 23 between SOI layer 3 and isolation oxide film 9 as shown in FIG. 6, as a result of improving the exposure state in the edge part of SOI layer 3, when a transistor is formed in SOI layer 3, the effect that the transistor of good transistor characteristics can be obtained is also acquired.

Although Embodiment 1 showed trench mask TM1 whose top layer is CVD oxide film 6, the same effect is obtained even if the top layer is formed with a polysilicon layer.

Embodiment 2

(Details of Manufacturing Method)

FIG. 7-FIG. 12 are the sectional views showing the manufacturing method of the semiconductor device which has the insulated isolation structure of partial and full isolation combined use which is Embodiment 2 of this invention. Hereafter, the manufacturing method of Embodiment 2 is explained with reference to these drawings.

Figure 7:
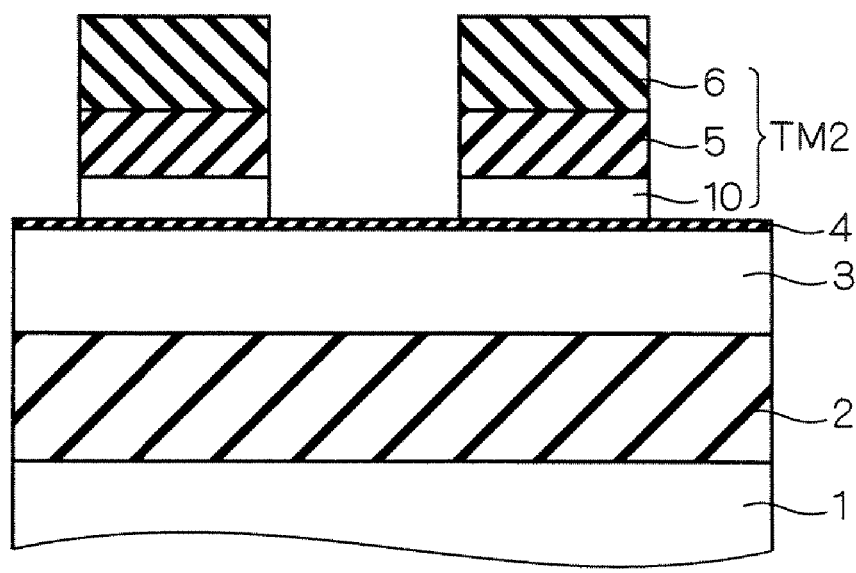
FIGS. 7 to 12 are sectional views showing the manufacturing method of the semiconductor device which is Embodiment 2.

First, as shown in FIG. 7, silicon oxide layer 4 which turns into an underlay oxide film is formed all over SOI layer 3 upper part of the SOI substrate which includes semiconductor substrate 1, embedded insulating layer 2, and SOI layer 3. After forming polysilicon layer 10 (mask layer for oxidation), silicon nitride film 5, and CVD oxide film 6 in the whole surface, patterning is performed using a photoengraving process etc. to polysilicon layer 10, silicon nitride film 5, and CVD oxide film 6. And trench mask TM2 of 3 layer structure including polysilicon layer 10, silicon nitride film 5, and CVD oxide film 6 which were patterned is obtained. About 50 nm thickness can be considered as thickness of polysilicon layer 10.

Figure 8:
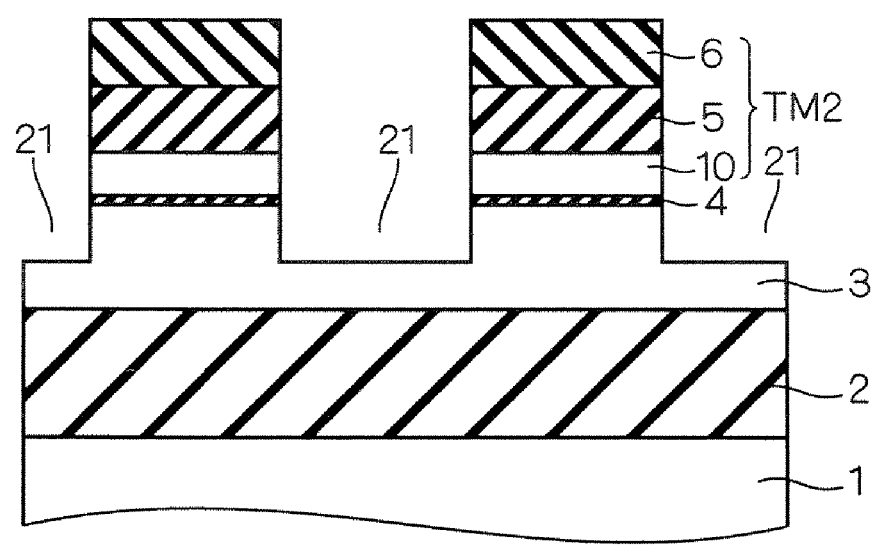

Then, as shown in FIG. 8, the first time and the second time dry etching are performed, respectively like Embodiment 1 to each of silicon oxide layer 4 and the upper layer portion of SOI layer 3 by using trench mask TM2 as a mask, trench 21 for isolation is formed. A part of upper layer portions of CVD oxide film 6 is removed in the case of removal of silicon oxide layer 4 in the first dry etching.

Figure 9:
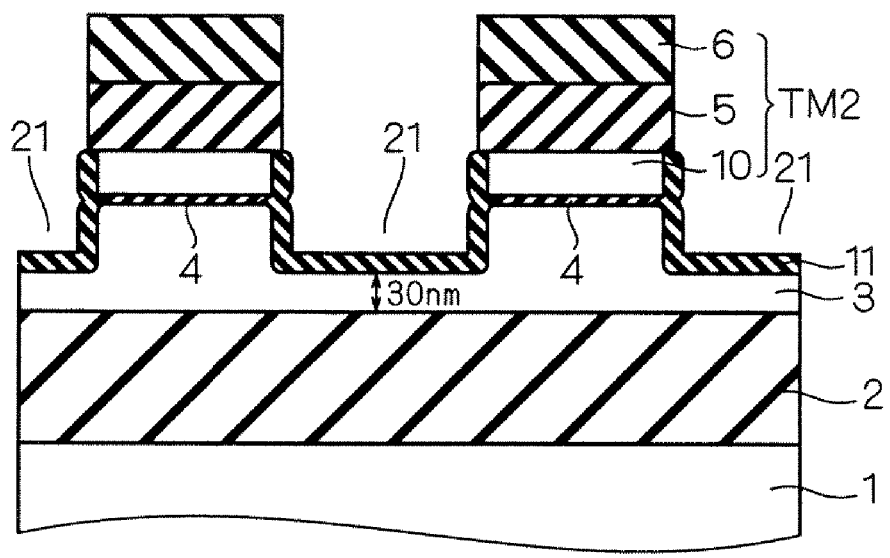

And as shown in FIG. 9, inner wall oxide film 11 is formed in the exposed surface of SOI layer 3, and the exposure side face of polysilicon layer 10 by thermal oxidation process, respectively. As a result, the thickness of SOI layer 3 under trench 21 for isolation is set to about 30 nm.

Figure 10:
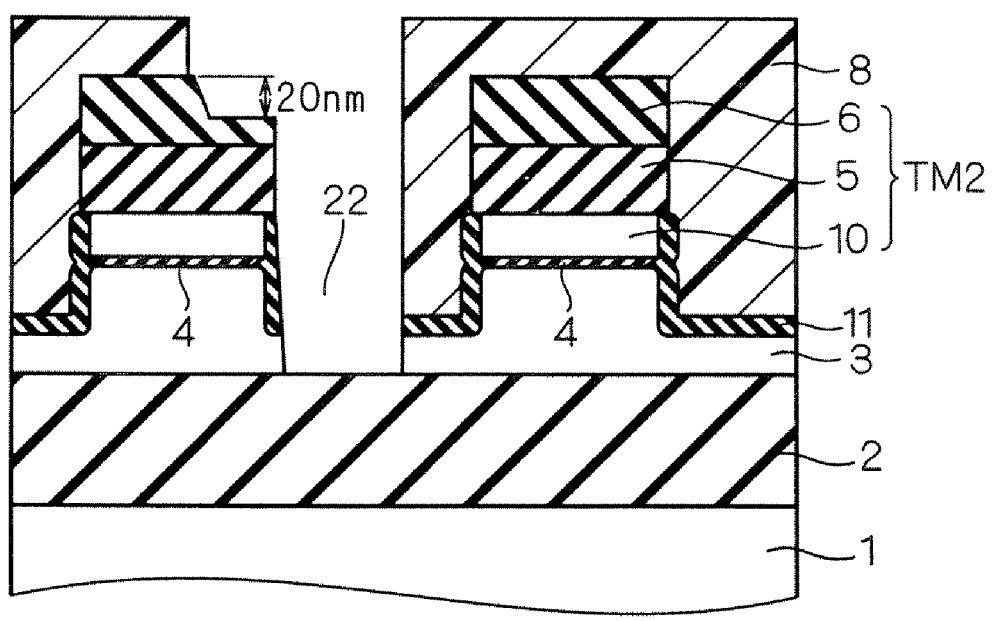

Next, as shown in FIG. 10, etching to inner wall oxide film 11 and SOI layer 3 is performed by using resist 8 patterned and trench mask TM2 as a mask, and trench 22 for full isolation to which the surface of embedded insulating layer 2 was exposed is formed. At this time, although a part of CVD oxide films 6 where resist 8 is not formed in the upper part is removed (removed by depth of about 20 nm in the example of FIG. 10), since silicon nitride film 5 under CVD oxide film 6 is not removed, the thickness of silicon nitride film 5 is kept constant.

Figure 11:
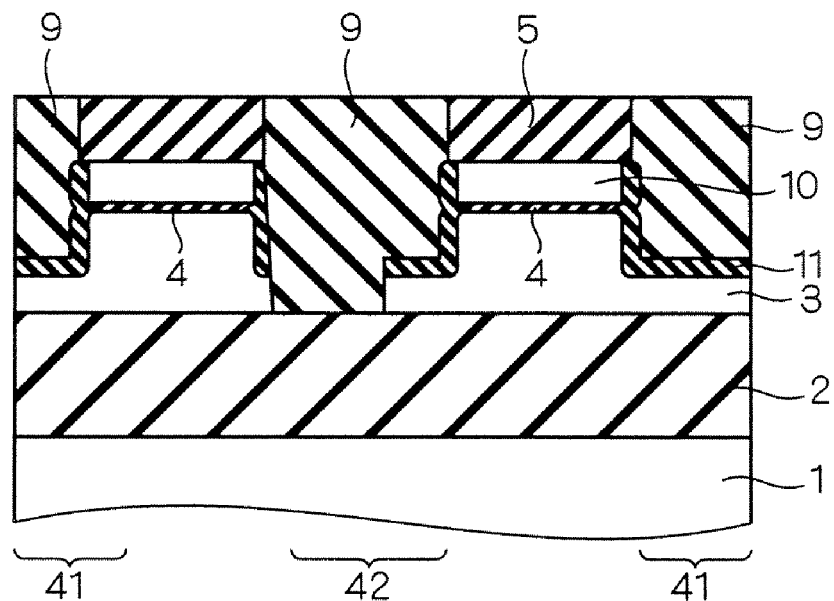

Then, as shown in FIG. 11, after removing resist 8 and depositing isolation oxide film 9 on the whole surface, flattening of the isolation oxide film 9 is made in the height specified by the thickness of silicon nitride film 5 by performing CMP treatment which used silicon nitride film 5 as the polishing stopper. Since the thickness of silicon nitride film 5 is kept uniform at this time, it works effectively as a polishing stopper.

Since CVD oxide film 6 on silicon nitride film 5 has the almost same grinding rate as isolation oxide film 9, all are removed at the time of CMP treatment. As a result, as for isolation oxide film 9, thickness is kept uniform like Embodiment 1.

Figure 12:
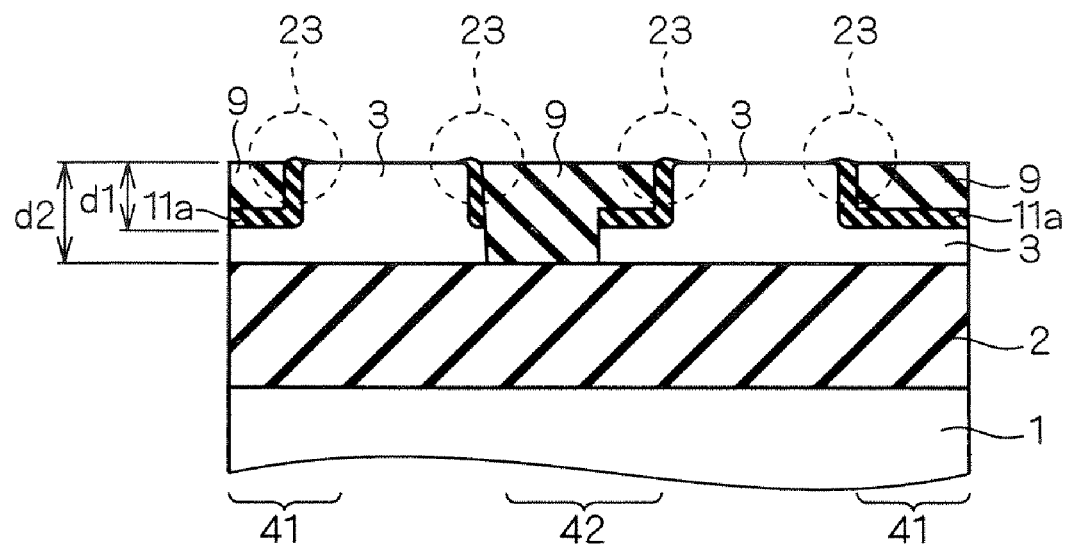

Then, after performing oxide film etching by fluoric acid in order to adjust the level difference of isolation oxide film 9, and the surface of SOI layer 3 as shown in FIG. 12, the insulated isolation structure of partial and full isolation combined use is completed by removing silicon nitride film 5 and polysilicon layer 10. As a result, in the insulated isolation structure of Embodiment 2, the thickness of isolation oxide film 9 in partial isolation region 41 is kept uniform by isolation oxide film thickness d1, and the thickness of isolation oxide film 9 in full isolation region 42 is kept uniform by isolation oxide film thickness d2 like Embodiment 1.

Inner wall oxide film 11 is formed also in the side face of polysilicon layer 10 as a thermal oxidation film at the time of formation of inner wall oxide film 11. Since the etching rate of this thermal oxidation film (inner wall oxide film 11) to fluoric acid is small compared with isolation oxide film 9, residual oxide film 11a is formed without removing in SOI layer end portion neighboring region 23 of SOI layer 3 after etching by the fluoric acid performed at the time of removal of isolation oxide film 9 and silicon oxide layer 4.

Although Embodiment 2 showed the example which used polysilicon layer 10 for the undermost layer of trench mask TM2 as a mask layer for oxidation, it can be substituted using the amorphous silicone which can take the large selection ratio in etching to silicon oxide layer 4 and in which a side face oxidizes at the time of a thermal oxidation process.

Effect of Embodiment 2

According to the manufacturing method of the semiconductor device of Embodiment 2, since the thickness of silicon nitride film 5 is uniform even after the formation of trench 22 for full isolation, over-polishing region 44 (refer to FIG. 44) does not generate, and the thickness and shape of isolation oxide film 9 are uniformly formed eventually. As a result, the effect that the variation in the transistor characteristics at the time of forming a transistor in SOI layer 3 can be decreased substantially is obtained like Embodiment 1.

In SOI layer end portion neighboring region 23 between SOI layer 3 and isolation oxide film 9, residual oxide film 11a remains a little exceeding the formation height of SOI layer 3. Therefore, as a result of improving the exposure state in the edge part of SOI layer 3 more than Embodiment 1, the effect of both suppressing the lowering of threshold voltage by the parasitic MOSFET phenomenon mentioned above and obtaining the transistor of better transistor characteristics when a transistor is formed in SOI layer 3 is obtained.

Embodiment 3

(Details of Manufacturing Method)

FIG. 13-FIG. 18 are the sectional views showing the manufacturing method of the semiconductor device which has the insulated isolation structure of partial and full isolation combined use which is Embodiment 3 of this invention. Hereafter, the manufacturing method of Embodiment 3 is explained with reference to these drawings.

First, as shown in FIG. 13, silicon oxide layer 4 which turns into an underlay oxide film is formed all over SOI layer 3 upper part of the SOI substrate which includes semiconductor substrate 1, embedded insulating layer 2, and SOI layer 3. Trench mask TM2 of 3 layer structure which includes polysilicon layer 10, silicon nitride film 5, and CVD oxide film 6 which were patterned like Embodiment 2 is obtained.

Then, as shown in FIG. 14, wet etching by fluoric acid only to silicon oxide layer 4 is performed by using trench mask TM2 as a mask, and only silicon oxide layer 4 is removed. Since the above-mentioned wet etching can take a large selection ratio with SOI layer 3 compared with dry etching, a part of SOI layer 3 is not removed like dry etching in the case of etching of silicon oxide layer 4. On the other hand, the pullback phenomenon that CVD oxide film 6 also pulls back in part at the time of the above-mentioned wet etching (removed) occurs.

About the pullback phenomenon of CVD oxide film 6, since the etching rate to the above-mentioned wet etching will become small when high temperature annealing is made after deposition of CVD oxide film 6, reduction of the amount of pullbacks can be aimed at. As high temperature annealing, an etching rate can be made sufficiently small by the process of about 30 minutes-2 hours at about 900° C.-1100° C. Although the etching rate in the wet etching described above becomes small to the same extent with a thermal oxidation film by aiming at the temperature rising of the temperature and the time increasing of processing time of high temperature annealing treatment, to check the conditions is suitably desired from the throughput of a manufacturing process, the constraint on a device, etc.

Figure 15:
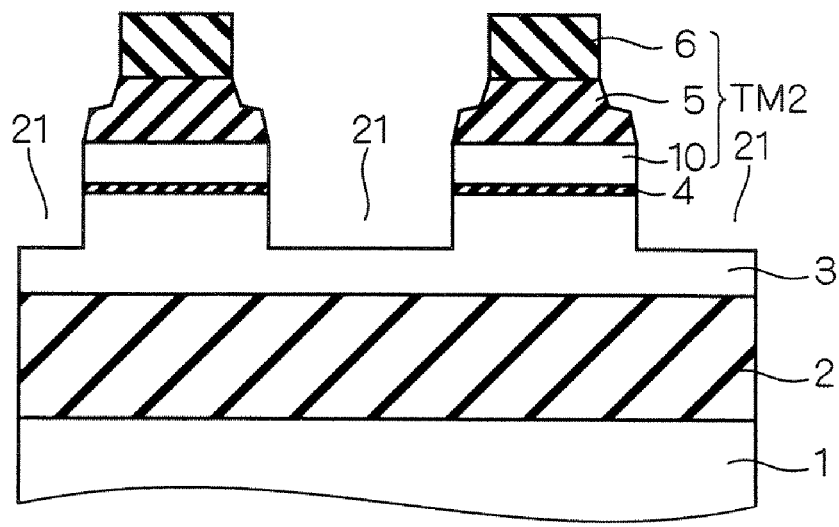

Then, as shown in FIG. 15, dry etching only of the upper layer portion of SOI layer 3 is made by using trench mask TM2 and silicon oxide layer 4 as a mask, and trench 21 for isolation is formed. On this occasion, a part of upper layer of the periphery of silicon nitride film 5 is removed.

Since a part of SOI layer 3 is not removed in the case of the wet etching to silicon oxide layer 4 as mentioned above, the trench depth of trench 21 for isolation is prescribed by only the amount of removal at the time of the dry etching to SOI layer 3 shown in FIG. 15. So, the depth controllability of trench 21 for isolation improves.

Figure 16:
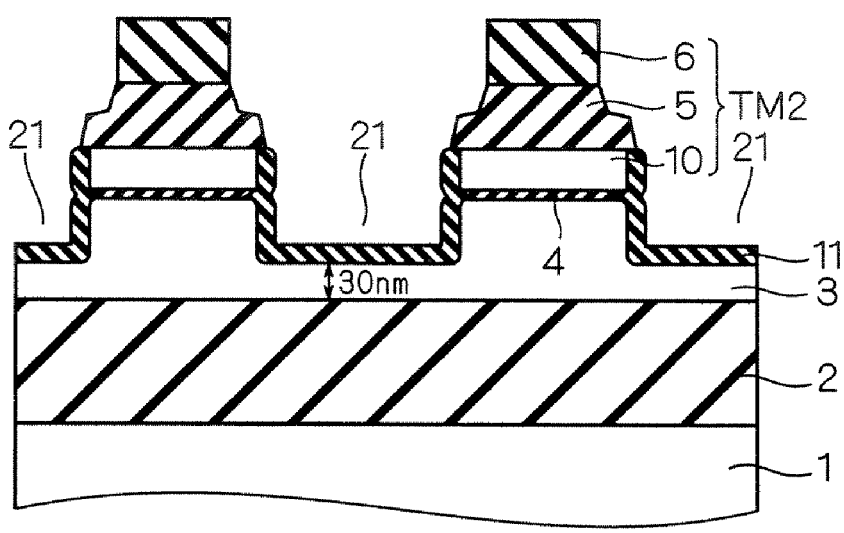

And as shown in FIG. 16, inner wall oxide film 11 is formed in the exposed surface of SOI layer 3, and the exposure side face of polysilicon layer 10 by thermal oxidation process, respectively. As a result, the thickness of SOI layer 3 under trench 21 for isolation is set to about 30 nm.

Figure 17:
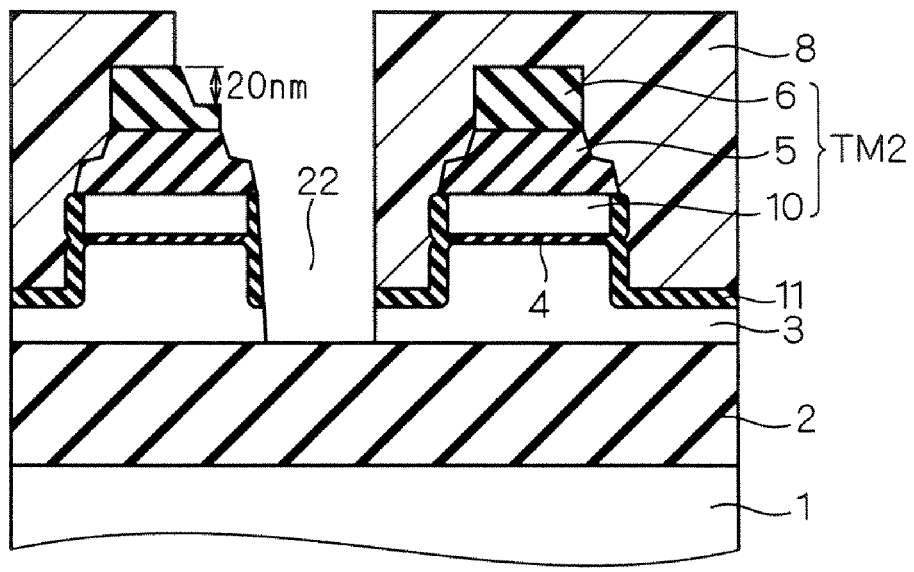

Then, as shown in FIG. 17, etching to inner wall oxide film 11 and SOI layer 3 is performed by using resist 8 patterned and trench mask TM2 as a mask, and trench 22 for full isolation to which the surface of embedded insulating layer 2 was exposed is formed. Although a part of CVD oxide films 6 on which resist 8 is not formed in the upper part are further removed at this time (removed by depth of about 20 nm in the example of FIG. 17) and the extremely small part of periphery of silicon nitride film 5 is removed, the thickness of silicon nitride film 5 is kept almost constant by existence of CVD oxide film 6.

Figure 18:
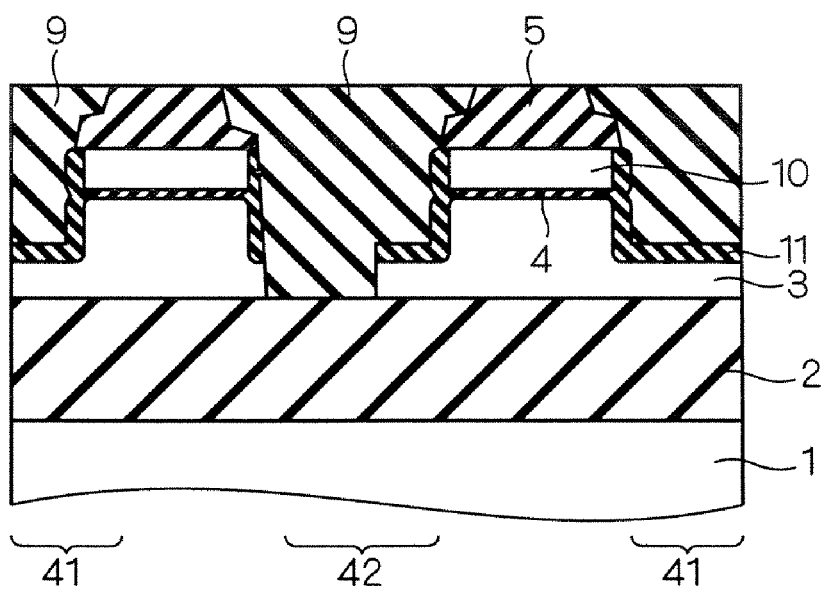

Then, as shown in FIG. 18, after removing resist 8 and depositing isolation oxide film 9 on the whole surface, flattening of the isolation oxide film 9 is made in the height of the topmost part of silicon nitride film 5 by performing CMP treatment which used silicon nitride film 5 as the polishing stopper. At this time, since the thickness of silicon nitride film 5 is kept almost uniform, it works effectively as a polishing stopper and, as for isolation oxide film 9, thickness is kept uniform like Embodiment 1 and Embodiment 2.

Then, although not illustrated, in order to adjust the level difference of isolation oxide film 9 and the surface of SOI layer 3, after performing oxide film etching by fluoric acid, the insulated isolation structure of partial and full isolation combined use is completed by removing silicon nitride film 5 and polysilicon layer 10. As a result, the isolation structure of Embodiment 3 can form uniformly the thickness of isolation oxide film 9 in partial isolation region 41 and full isolation region 42 like Embodiment 1 and Embodiment 2.

Effect of Embodiment 3

According to the manufacturing method of the semiconductor device of Embodiment 3, since the thickness of silicon nitride film 5 is almost uniform even after the formation of trench 22 for full isolation, the effect that the variation in the transistor characteristics at the time of forming a transistor in SOI layer 3 can be substantially decreased is obtained like Embodiment 1 and Embodiment 2.

In the isolation structure acquired with the manufacturing method of Embodiment 3, the exposure state in the edge part of SOI layer 3 is improved like Embodiment 2 more than Embodiment 1. As a result, when a transistor is formed in SOI layer 3, the effect of both suppressing the lowering of threshold voltage by the parasitic MOSFET phenomenon mentioned above and obtaining the transistor of better transistor characteristics is acquired.

In addition, in Embodiment 3, as shown in FIG. 14 and FIG. 15, in order for wet etching with a large selection ratio with SOI layer 3 to perform the removal process (FIG. 14) of silicon oxide layer 4, only silicon oxide layer 4 can be removed surely, without removing SOI layer 3 at the time of this wet etching. As a result, since only the dry etching removal process (FIG. 15) of the upper layer portion by the dry etching to SOI layer 3 performed after that can prescribe the formation depth of trench 21 for isolation, the effect that the trench depth controllability of SOI layer 3 improves is obtained.

Embodiment 4

(Details of Manufacturing Method)

FIG. 19-FIG. 24 are the sectional views showing the manufacturing method of the semiconductor device which has the insulated isolation structure of partial and full isolation combined use which is Embodiment 4 of this invention. Hereafter, the manufacturing method of Embodiment 4 is explained with reference to these drawings.

Figure 19:
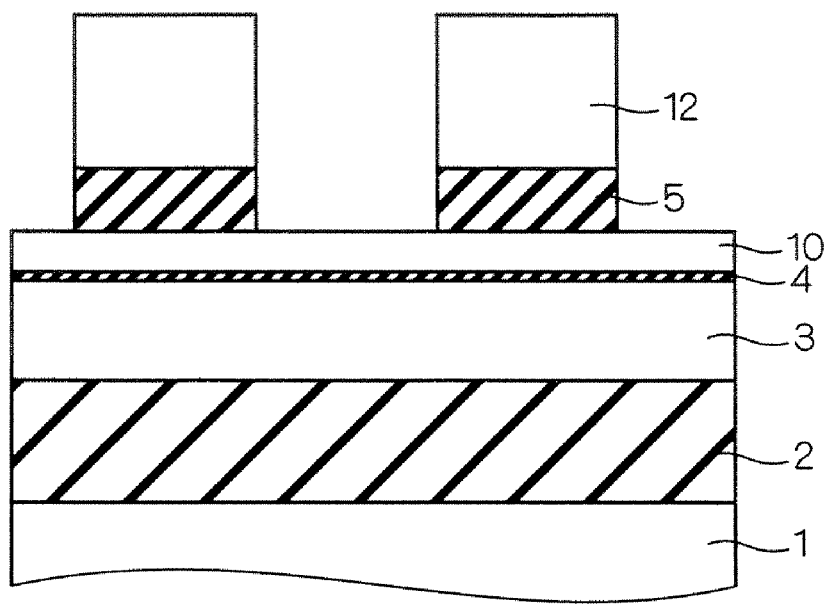
FIGS. 19 to 24 are sectional views showing the manufacturing method of the semiconductor device which is Embodiment 4.

First, as shown in FIG. 19, silicon oxide layer 4 which turns into an underlay oxide film is formed all over SOI layer 3 upper part of the SOI substrate which includes semiconductor substrate 1, embedded insulating layer 2, and SOI layer 3. After depositing polysilicon layer 10, silicon nitride film 5, and polysilicon layer 12 one by one, polysilicon layer 12 and silicon nitride film 5 are patterned first. About 160 nm thickness can be considered as thickness of polysilicon layer 12.

Figure 20:
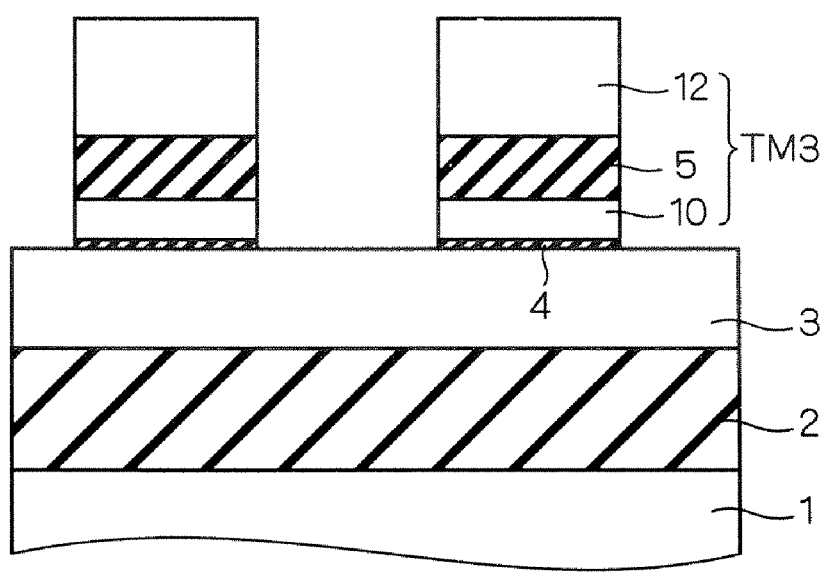

Then, as shown in FIG. 20, patterning to polysilicon layer 10 is performed further, and trench mask TM3 which includes patterned polysilicon layer 10, silicon nitride film 5, and polysilicon layer 12 (second mask layer) is obtained. Some upper layer portions of polysilicon layer 12 are also removed in the case of patterning to polysilicon layer 10.

Then, as shown in FIG. 20, by using trench mask TM3 as a mask, like Embodiment 3, wet etching by fluoric acid only to silicon oxide layer 4 is performed, and only silicon oxide layer 4 is removed. Since the top layer part of trench mask TM3 is polysilicon layer 12 at this time, a pullback phenomenon like CVD oxide film 6 of Embodiment 3 is not generated.

Figure 21:
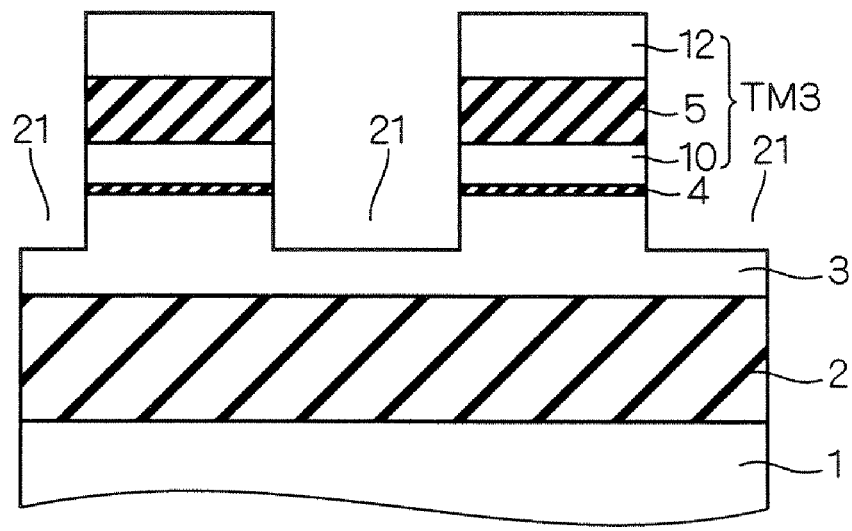

Then, as shown in FIG. 21, only the upper layer portion of SOI layer 3 is etched like Embodiment 3 by using trench mask TM3 and silicon oxide layer 4 as a mask, and trench 21 for isolation is formed. On this occasion, some upper layer portions of polysilicon layer 12 are also removed.

Figure 22:
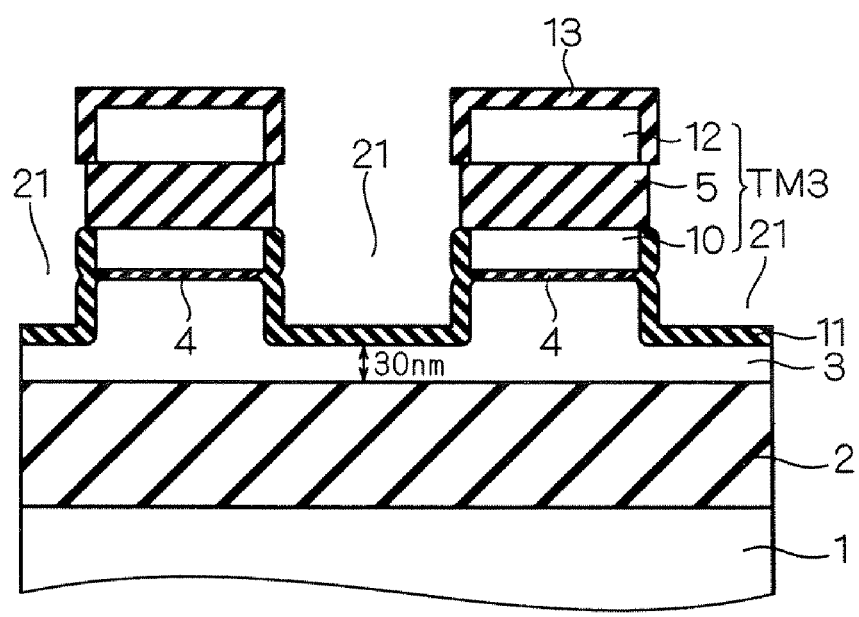

And as shown in FIG. 22, inner wall oxide film 11 is formed in the exposed surface of SOI layer 3, and the exposure side face of polysilicon layer 10 by thermal oxidation process, respectively. On this occasion, inner wall oxide film 13 is formed also in the upper surface and the side face of polysilicon layer 12. As a result, the thickness of SOI layer 3 under trench 21 for isolation is set to about 30 nm.

Figure 23:
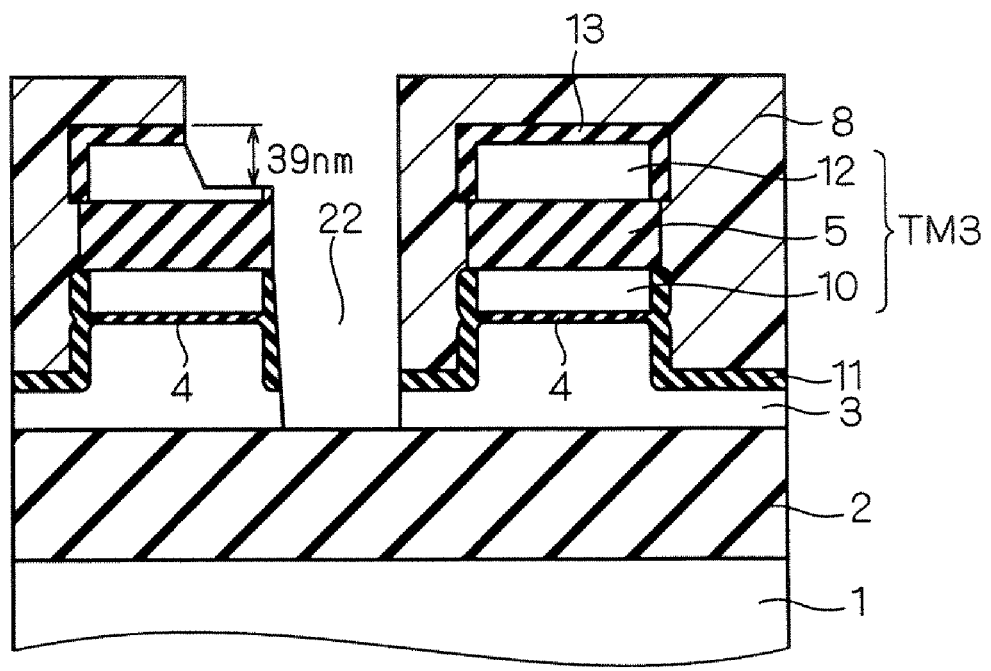

Then, as shown in FIG. 23, etching to inner wall oxide film 11 and SOI layer 3 is performed by using resist 8 patterned and trench mask TM3 as a mask, and trench 22 for full isolation to which the surface of embedded insulating layer 2 was exposed is formed. At this time, although a part of inner wall oxide film 13 and polysilicon layer 12 where resist 8 is not formed in the upper part is removeed (polysilicon layer 12 being removed by depth of about 39 nm in the example of FIG. 23), since silicon nitride film 5 under polysilicon layer 12 is not removed, the thickness of silicon nitride film 5 is kept constant.

Figure 24:
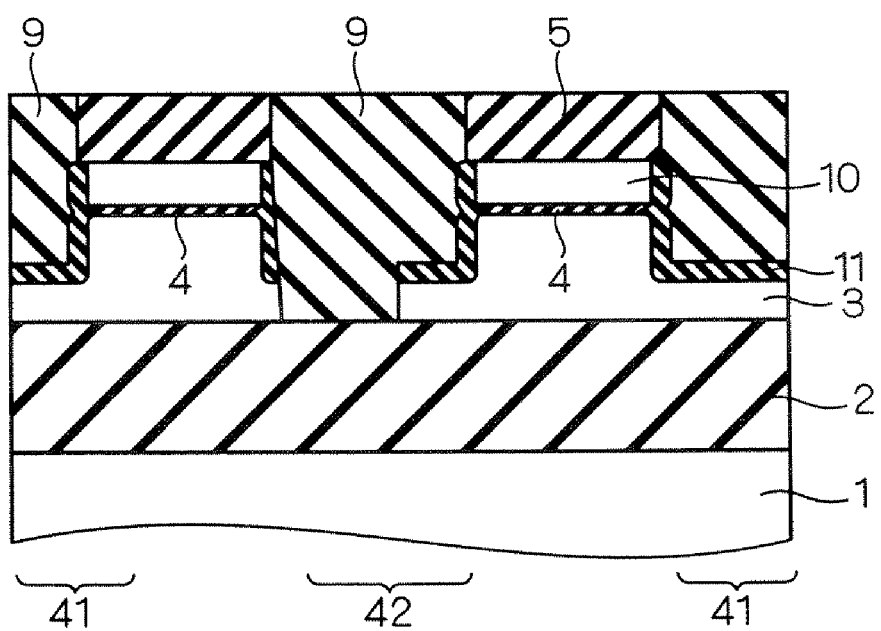

Then, as shown in FIG. 24, after removing resist 8 and depositing isolation oxide film 9 on the whole surface, flattening of the isolation oxide film 9 is made in the height specified by the thickness of silicon nitride film 5 by performing CMP treatment which used silicon nitride film 5 as the polishing stopper. Since the thickness of silicon nitride film 5 is kept uniform at this time, it works effectively as a polishing stopper and, as for isolation oxide film 9, thickness is kept uniform like Embodiment 1-Embodiment 3.

Then, although not illustrated, in order to adjust the level difference of isolation oxide film 9 and the surface of SOI layer 3, after performing oxide film etching by fluoric acid, the insulated isolation structure of partial and full isolation combined use is completed by removing silicon nitride film 5 and polysilicon layer 10. As a result, the insulated isolation structure of Embodiment 4 can form uniformly the thickness of isolation oxide film 9 in partial isolation region 41 and full isolation region 42 like Embodiment 1-Embodiment 3.

Effect of Embodiment 4

According to the manufacturing method of the semiconductor device of Embodiment 4, since the thickness of silicon nitride film 5 is uniform even after the formation of trench 22 for full isolation, the effect that the variation in the transistor characteristics at the time of forming a transistor in SOI layer 3 can be substantially decreased is obtained like Embodiment 1-Embodiment 3.

Like Embodiment 2 and Embodiment 3, as a result of improving the exposure state in the edge part of SOI layer 3 more than Embodiment 1, when a transistor is formed in SOI layer 3, the effect that the lowering of threshold voltage by the parasitic MOSFET phenomenon mentioned above can be suppressed while obtaining the transistor of better transistor characteristics is obtained.

In addition, by performing the removal process (FIG. 20) of silicon oxide layer 4 by wet etching, and performing the removal process (FIG. 21) of the upper layer portion of SOI layer 3 by dry etching, as shown in FIG. 20 and FIG. 21, the effect that the trench depth controllability of SOI layer 3 improves is obtained like Embodiment 3.

Furthermore, in addition, the pullback phenomenon of polysilicon layer 12 does not happen at the time of the wet etching of silicon oxide layer 4 by using polysilicon layer 12 with a large selection ratio in the wet etching to silicon oxide layer 4 for the top layer of trench mask TM3. So, the effect that further improvement of uniformity in the thickness of silicon nitride film 5 can be aimed at compared with Embodiment 3, and the decrease more than Embodiment 3 can be aimed at regarding the variation in the transistor characteristics mentioned above is obtained.

Embodiment 5

(Details of Manufacturing Method)

Figure 25:
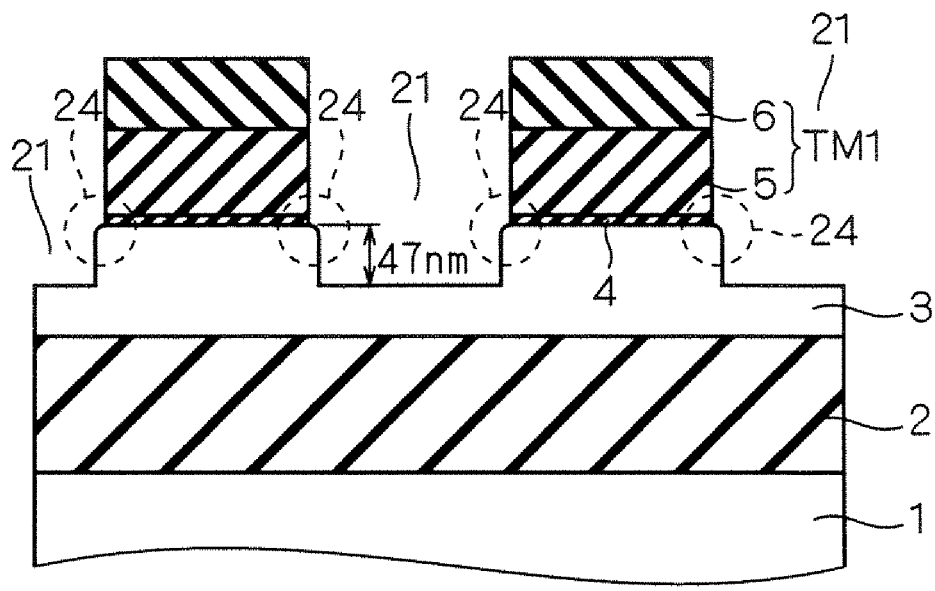
FIGS. 25 to 27 are sectional views showing the manufacturing method of the semiconductor device which is Embodiment 5.
Figure 26:
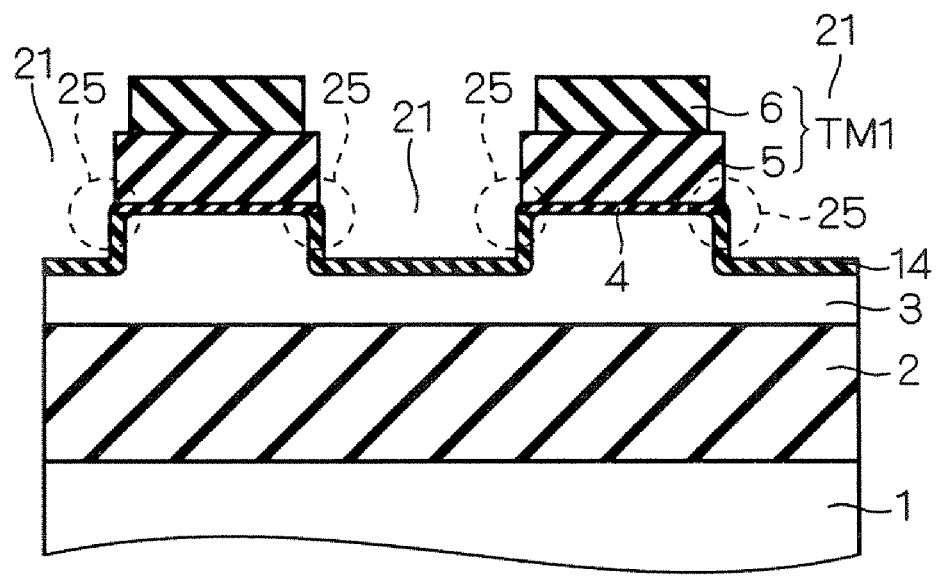
Figure 27:
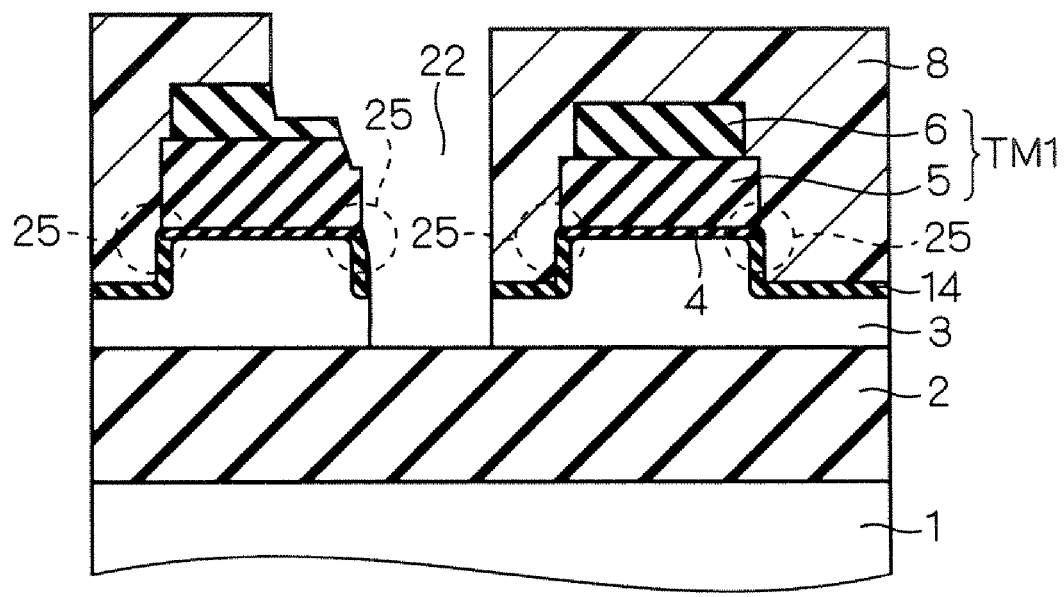

FIG. 25-FIG. 27 are the sectional views showing the manufacturing method of the semiconductor device which has the insulated isolation structure of partial and full isolation combined use which is Embodiment 5 of this invention. Hereafter, the manufacturing method of Embodiment 5 is explained with reference to these drawings.

First, as shown in FIG. 25, silicon oxide layer 4 which turns into an underlay oxide film is formed all over SOI layer 3 upper part of the SOI substrate which includes semiconductor substrate 1, embedded insulating layer 2, and SOI layer 3. Further, trench mask TM1 of 2 layer structure which includes silicon nitride film 5 and CVD oxide film 6 which were patterned like Embodiment 1 is obtained. Then, the 1st time and the 2nd time dry etching are performed like Embodiment 1 to the upper layer portion of silicon oxide layer 4 and SOI layer 3 by using trench mask TM1 as a mask, and trench 21 for isolation is formed.

On this occasion, by advancing etching, adjusting a gas mixing ratio etc. at the time of the dry etching to SOI layer 3, and making a polymer membrane deposit, about 10 nm of shape of SOI layer 3 is made to project outside from silicon nitride film 5 of trench mask TM1 in plan view, and rounding etching of rounding SOI layer end portion neighboring region 24 is performed.

And as shown in FIG. 26, inner wall oxide film 14 is formed in the exposed surface of SOI layer 3 by thermal oxidation process. On this occasion, the thickness of inner wall oxide film 14 is adjusted so that the end portion of SOI layer 3 may be located inside silicon nitride film 5 in plan view (refer to SOI layer end portion neighboring region 25). Simultaneously, although a part of CVD oxide films 6 are removed, silicon nitride film 5 is not removed.

Then, as shown in FIG. 27, etching to inner wall oxide film 14 and SOI layer 3 is performed by using resist 8 patterned and trench mask TM1 as a mask, and trench 22 for full isolation to which the surface of embedded insulating layer 2 was exposed is formed. Although a part of CVD oxide films 6 (CVD oxide film 6 is removed by depth of about 25 nm in the example of FIG. 27) on which resist 8 is not formed in the upper part, and the extremely small part of silicon nitride film 5 are removed at this time, removal of silicon nitride film 5 can be managed with extent which does not affect the uniformity of the thickness by existence of CVD oxide film 6.

Then, the insulated isolation structure of partial and full isolation combined use is acquired, passing through flattening of isolation oxide film 9 by CMP treatment, the oxide film etching process by fluoric acid for adjusting the level difference of isolation oxide film 9 and the surface of SOI layer 3, etc. like Embodiment 1.

Effect of Embodiment 5

According to the manufacturing method of the semiconductor device of Embodiment 5, since the thickness of silicon nitride film 5 is uniform even after the formation of trench 22 for full isolation, the variation in the transistor characteristics at the time of forming a transistor in SOI layer 3 can be substantially decreased like Embodiment 1-Embodiment 4.

Since the edge part of SOI layer 3 is rounded by performing rounding etching mentioned above at the time of formation of trench 21 for isolation, concentration of a gate electric field is eased in the end portion of an SOI layer, and the effect that the threshold voltage lowering by the parasitic MOSFET phenomenon mentioned above can be suppressed effectively is obtained.

Although Embodiment 5 showed trench mask TM1 whose top layer is CVD oxide film 6, the same effect is obtained even if it forms the top layer by a polysilicon layer.

Embodiment 6

(Details of Manufacturing Method)

Figure 28:
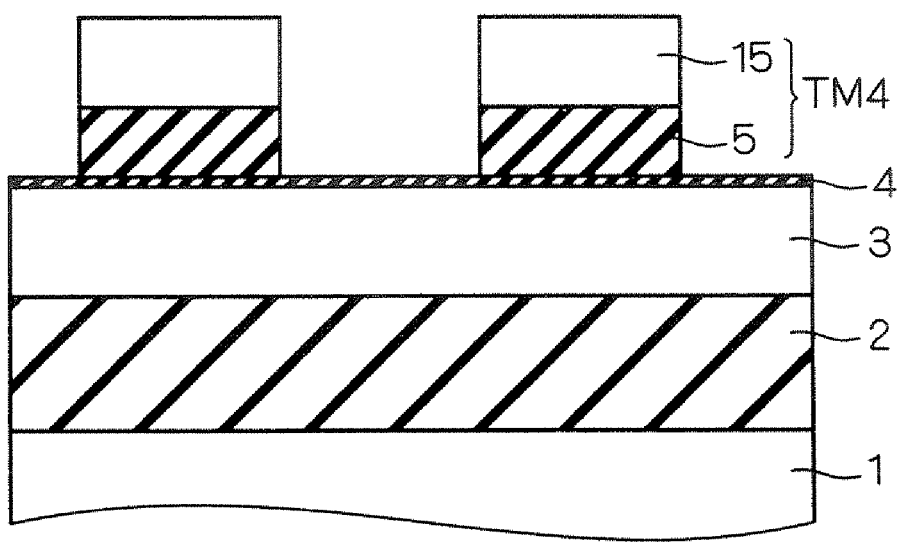
FIGS. 28 to 30 are sectional views showing the manufacturing method of the semiconductor device which is Embodiment 6.
Figure 29:
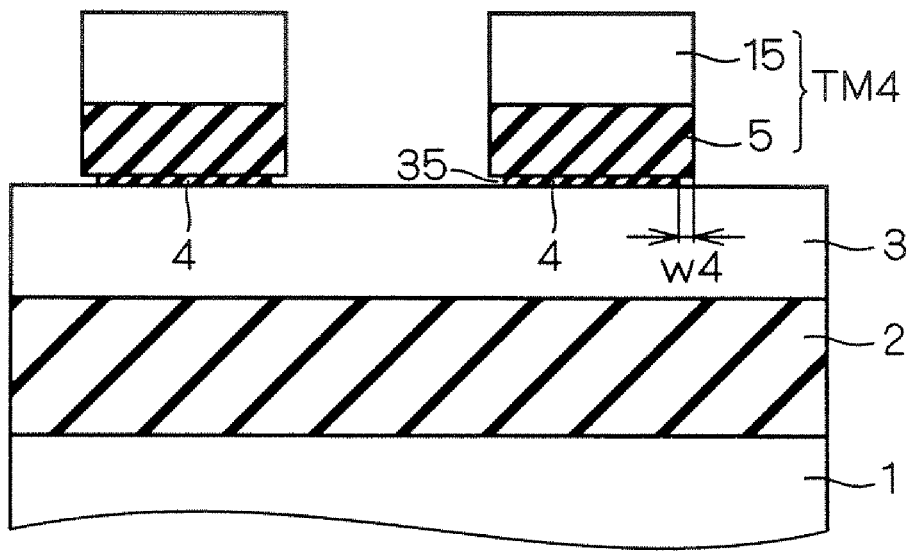
Figure 30:
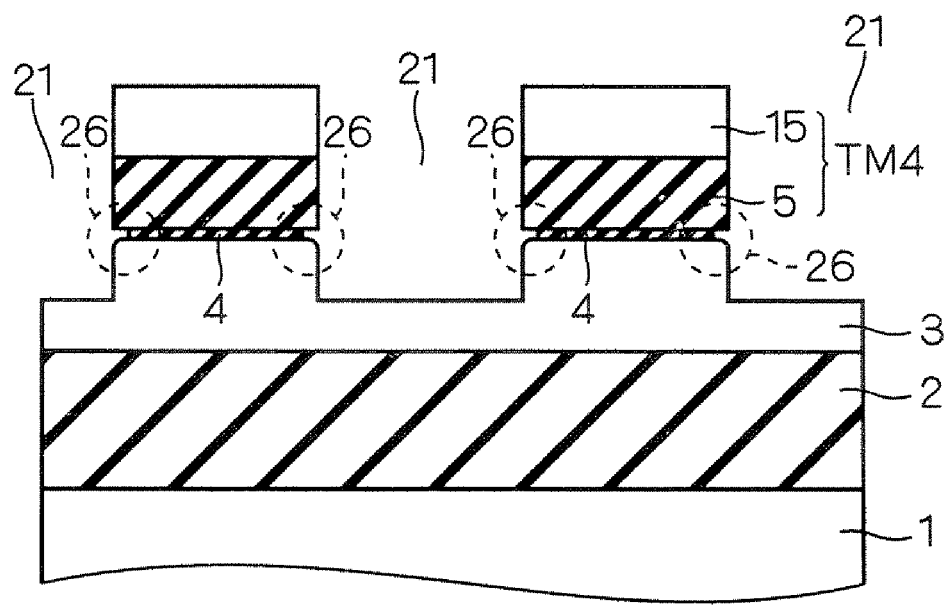

FIG. 28-FIG. 30 are the sectional views showing the manufacturing method of the semiconductor device which has the insulated isolation structure of partial and full isolation combined use which is Embodiment 6 of this invention. Hereafter, the manufacturing method of Embodiment 6 is explained with reference to these drawings.

First, as shown in FIG. 28, silicon oxide layer 4 which turns into an underlay oxide film is formed all over SOI layer 3 upper part of the SOI substrate which includes semiconductor substrate 1, embedded insulating layer 2, and SOI layer 3, and it deposits in order of silicon nitride film 5 and polysilicon layer 15. Then, silicon nitride film 5 and polysilicon layer 15 are patterned, and trench mask TM4 of 2 layer structure which includes silicon nitride film 5 and polysilicon layer 15 (second mask layer) which were patterned is obtained. About 95 nm thickness can be considered as thickness of polysilicon layer 15.

Then, as shown in FIG. 29, only silicon oxide layer 4 is etched by using trench mask TM4 as a mask using the wet etching by fluoric acid. On this occasion, etching time is adjusted and a part for overhang width w4 is made to make an overhang to inside from the edge of silicon nitride film 5 under silicon nitride film 5 of trench mask TM4. As a result, between the edge part of silicon nitride film 5, and SOI layer 3, cavity part 35 in which silicon oxide layer 4 is not formed is formed.

Since the top layer of trench mask TM4 is formed by polysilicon layer 15, polysilicon layer 15 is not removed at the time of etching to silicon oxide layer 4.

Then, as shown in FIG. 30, only the upper layer portion of SOI layer 3 is etched by using trench mask TM4 and silicon oxide layer 4 as a mask, and trench 21 for isolation is formed. On this occasion, when an etchant turns to cavity part 35, chamfering advances in SOI layer end portion neighboring region 26 of SOI layer 3, and the edge part of SOI layer 3 is rounded. A part of upper layer portions of polysilicon layer 15 is removed in the case of removal of SOI layer 3.

Then, although not illustrated, like Embodiment 5, the trench for full isolation is formed and the insulated isolation structure of partial and full isolation combined use is acquired, passing through flattening of the isolation oxide film by CMP treatment, the oxide film etching process by fluoric acid for adjusting the level difference of an isolation oxide film and the surface of SOI layer 3, etc.

Effect of Embodiment 6

According to the manufacturing method of the semiconductor device of Embodiment 6, since the thickness of silicon nitride film 5 is uniform even after the formation of trench 22 for full isolation, the effect of decreasing substantially the variation in the transistor characteristics at the time of forming a transistor in SOI layer 3 is obtained like Embodiment 5.

In addition, since the top layer of trench mask TM4 is formed by polysilicon layer 15, polysilicon layer 15 is not removed at the time of etching to silicon oxide layer 4. So, as a result of the uniformity of the thickness of silicon nitride film 5 improving more, the above-mentioned effect can be demonstrated more than Embodiment 5.

The edge part of SOI layer 3 can be rounded at the time of formation of trench 21 for isolation by removing silicon oxide layer 4 so that cavity part 35 may occur between silicon nitride film 5 and SOI layer 3. Therefore, like Embodiment 5, concentration of a gate electric field is eased in the end portion of an SOI layer, and the threshold voltage lowering by the parasitic MOSFET phenomenon mentioned above can be suppressed effectively.

Embodiment 7

(Details of Manufacturing Method)

FIG. 31-FIG. 36 are the sectional views showing the manufacturing method of the semiconductor device which has the insulated isolation structure of partial and full isolation combined use which is Embodiment 7 of this invention. Hereafter, the manufacturing method of Embodiment 7 is explained with reference to these drawings.

Figure 31:
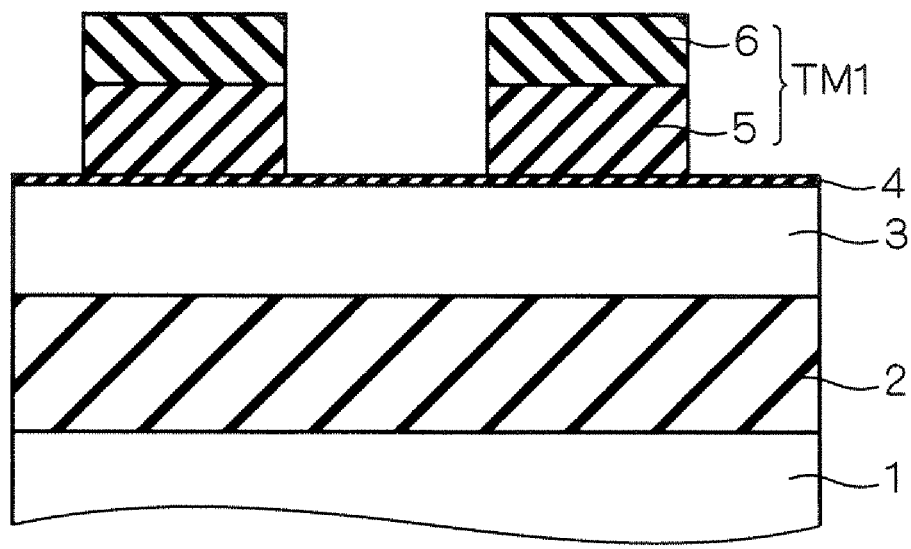
FIGS. 31 to 36 are sectional views showing the manufacturing method of the semiconductor device which is Embodiment 7.

First, as shown in FIG. 31, silicon oxide layer 4 which turns into an underlay oxide film is formed all over SOI layer 3 upper part of the SOI substrate which includes semiconductor substrate 1, embedded insulating layer 2, and SOI layer 3 like Embodiment 1. Further, trench mask TM1 of 2 layer structure which includes silicon nitride film 5 and CVD oxide film 6 which were patterned is obtained. About 55 nm thickness can be considered as thickness of CVD oxide film 6 of trench mask TM1.

Figure 32:
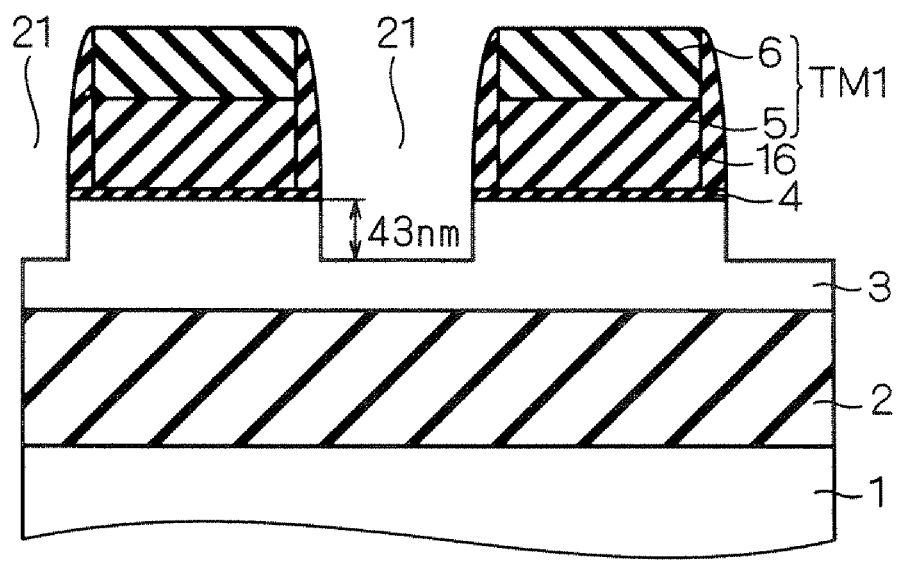

Then, as shown in FIG. 32, after forming a CVD oxide film on the whole surface, sidewall 16 is formed on the side wall of trench mask TM1 by etching back. On this occasion, the upper layer portion of CVD oxide film 6 and silicon oxide layer 4 are also removed selectively. Further, trench 21 for isolation is formed by etching the upper layer portion of SOI layer 3 by using trench mask TM1 and sidewall 16 as a mask. On this occasion, about 43 nm of SOI layers 3 are removed.

Figure 33:
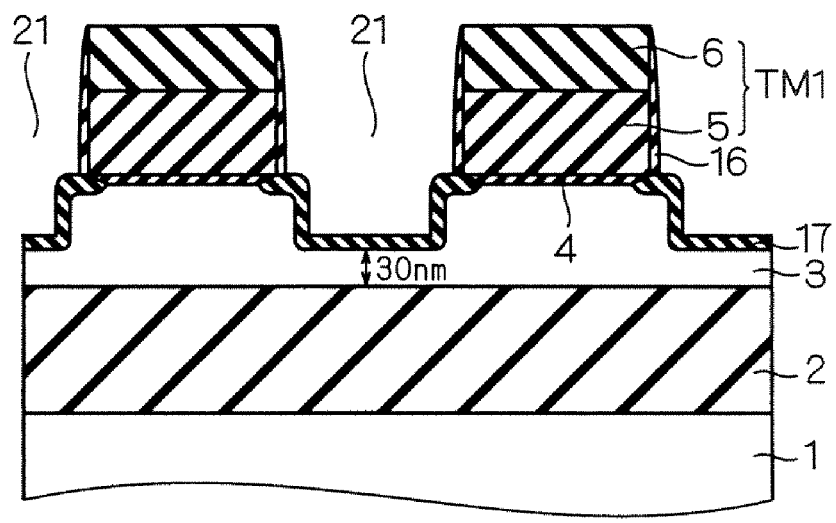

And as shown in FIG. 33, inner wall oxide film 17 is formed in the exposed surface of SOI layer 3 by thermal oxidation process. On this occasion, since the oxidation from the upper part also advances under sidewall 16, inner wall oxide film 17 which is a thermal oxidation film is formed as the edge part of SOI layer 3 is covered. Therefore, the thickness near the edge part of SOI layer 3 of inner wall oxide film 17 becomes thicker than the other region while the edge part of SOI layer 3 is rounded. At this time, the thickness of SOI layer 3 under trench 21 for isolation is set to about 30 nm.

Figure 34:
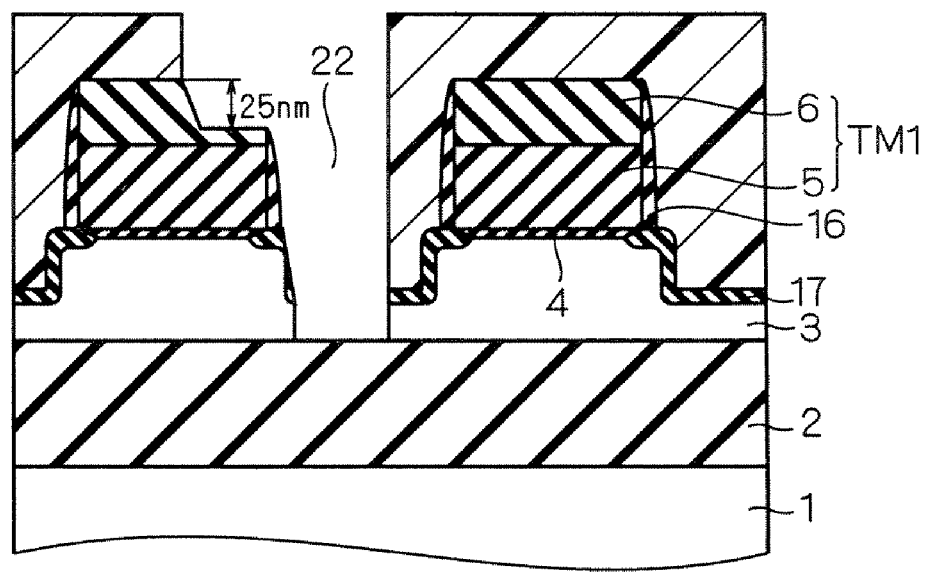

Then, as shown in FIG. 34, etching to inner wall oxide film 17 and SOI layer 3 is performed by using resist 8 patterned and trench mask TM1 as a mask, and trench 22 for full isolation to which the surface of embedded insulating layer 2 was exposed is formed. At this time, although a part of CVD oxide films 6 where resist 8 is not formed in the upper part is removed (removed by depth of about 25 nm in the example of FIG. 34), since silicon nitride film 5 under CVD oxide film 6 is not removed, the thickness of silicon nitride film 5 is kept constant.

Figure 35:
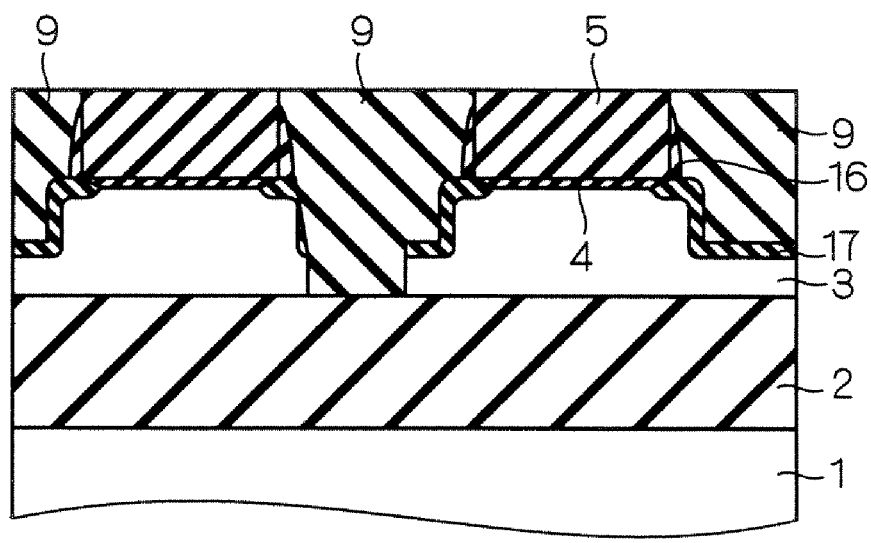

Then, as shown in FIG. 35, like Embodiment 1, resist 8 is removed, CMP treatment is performed, and flattening of the isolation oxide film 9 is made. Since the thickness of silicon nitride film 5 is kept uniform at this time, it works effectively as a polishing stopper.

Figure 36:
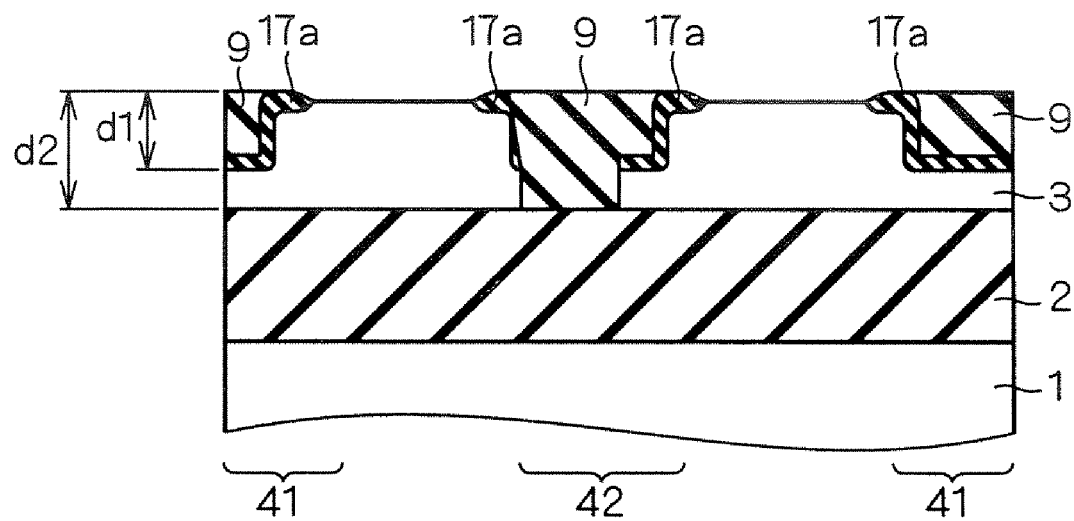

Then, as shown in FIG. 36, as a result of removing silicon nitride film 5 after performing oxide film etching by fluoric acid for adjusting the level difference of isolation oxide film 9 and the surface of SOI layer 3, the insulated isolation structure of partial and full isolation combined use is acquired. As a result, the thickness of isolation oxide film 9 in partial isolation region 41 is kept uniform by isolation oxide film thickness d1, and the thickness of isolation oxide film 9 in full isolation region 42 is kept uniform by isolation oxide film thickness d2. Residual oxide film 17a remains under the bottom face of isolation oxide film 9 in partial isolation region 41, and between isolation oxide film 9 and SOI layer 3 in partial isolation region 41 and full isolation region 42. This residual oxide film 17a remains by thick thickness in the edge part of SOI layer 3.

Effect of Embodiment 7

According to the manufacturing method of the semiconductor device of Embodiment 7, since the thickness of silicon nitride film 5 is uniform even after formation of trench 22 for full isolation as well as Embodiment 1-Embodiment 6, the variation in the transistor characteristics at the time of forming a transistor in SOI layer 3 can be decreased substantially.

Since sidewall 16 exists at the time of formation of inner wall oxide film 17, as a result of the thickness near the edge part of SOI layer 3 of inner wall oxide film 17 becoming thicker than another regions, in the SOI layer end portion neighboring region between SOI layer 3 and isolation oxide film 9, residual oxide film 17a remains exceeding the formation height of SOI layer 3. So, as a result of improving the exposure state in the edge part of SOI layer 3 more than Embodiment 1, the effect that the lowering of threshold voltage by the parasitic MOSFET mentioned above can be suppressed while obtaining the transistor of better transistor characteristics when a transistor is formed in SOI layer 3 is acquired.

In Embodiment 7, although the top layer of trench mask TM1 was formed with CVD oxide film 6, even if it uses a polysilicon layer instead, the same effect is obtained.

Embodiment 8

(Details of Manufacturing Method)

FIG. 37-FIG. 42 are the sectional views showing the manufacturing method of the semiconductor device which has the insulated isolation structure of partial and full isolation combined use which is Embodiment 8 of this invention. Hereafter, the manufacturing method of Embodiment 8 is explained with reference to these drawings.

Figure 37:
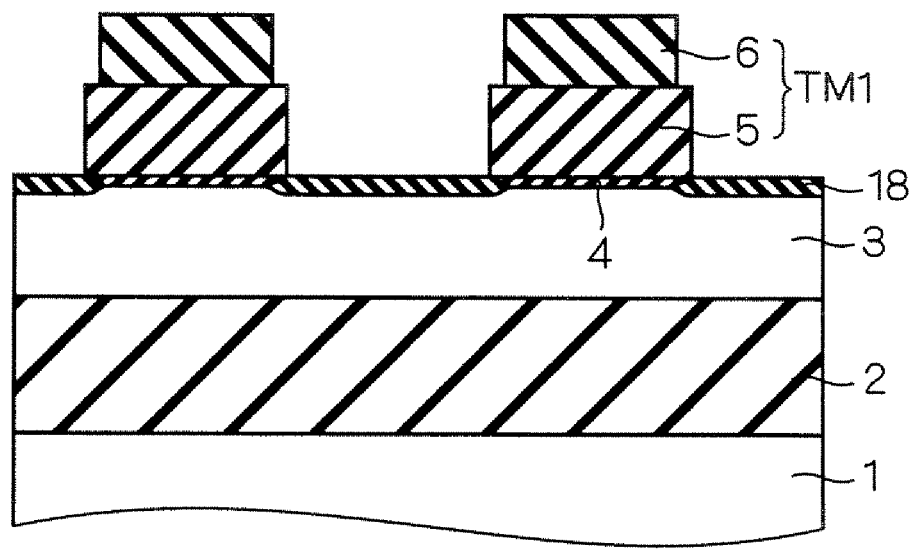

First, as shown in FIG. 37, silicon oxide layer 4 which turns into an underlay oxide film is formed all over SOI layer 3 upper part of the SOI substrate which includes semiconductor substrate 1, embedded insulating layer 2, and SOI layer 3 like Embodiment 1. Further, trench mask TM1 of 2 layer structure which includes silicon nitride film 5 and CVD oxide film 6 which were patterned is obtained. Then, pretreatment of RCA washing treatment using chemicals, such as ammonia/hydrogen peroxide solution, etc. is performed, after removing silicon oxide layer 4 on which trench mask TM1 is not formed, a thermal oxidation process is performed, the exposed part of SOI layer 3 is oxidized, and exposed surface oxidation region 18 is obtained. Exposed surface oxidation region 18 is formed by thickness thicker than silicon oxide layer 4. For example, when the thickness of silicon oxide layer 4 is 10 nm, exposed surface oxidation region 18 of about 17 nm thickness is formed. On this occasion, CVD oxide film 6 pulls back in part.

Figure 38:
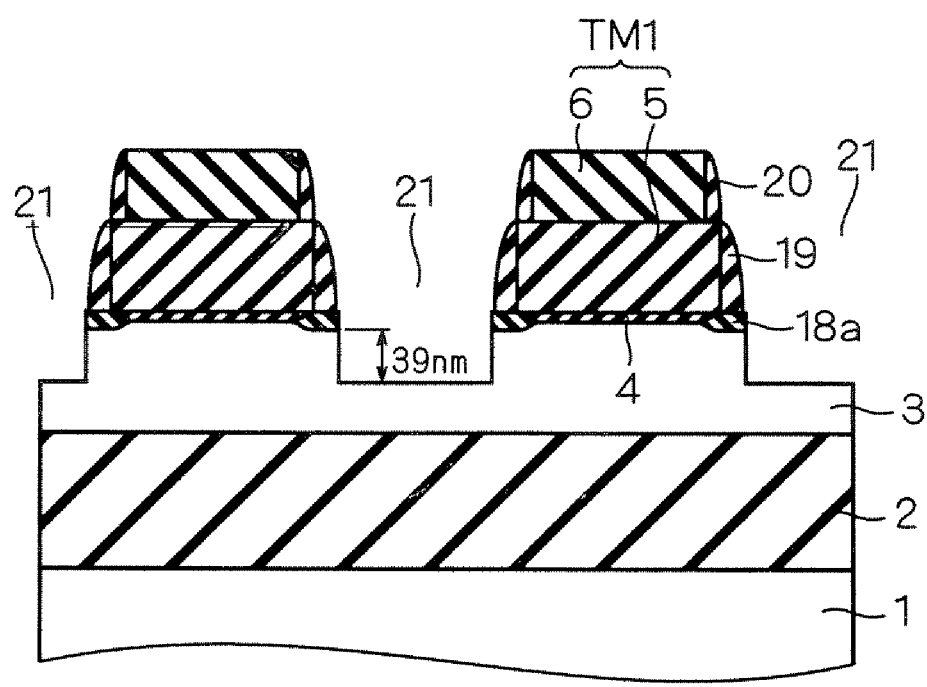

Then, as shown in FIG. 38, after forming a CVD oxide film on the whole surface, by etching back, sidewall 19 is formed on the side wall of silicon nitride film 5, and sidewall 20 is formed on the side wall of CVD oxide film 6. On this occasion, exposed surface oxidation region 18 is also removed selectively, and only exposed surface oxidation region 18 under sidewall 19 remains as residual exposed surface oxidation region 18a. Further, trench 21 for isolation is formed by etching the upper layer portion of SOI layer 3 by using trench mask TM1 and sidewalls 19 and 20 as a mask.

Figure 39:
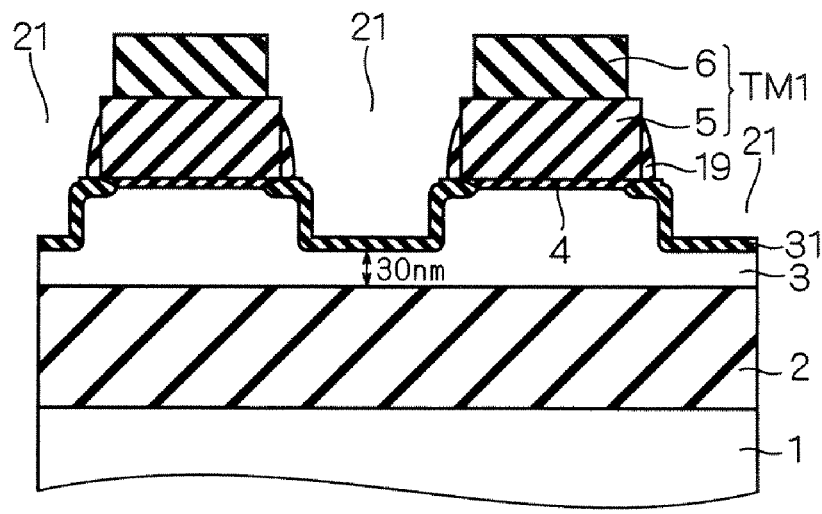

And as shown in FIG. 39, inner wall oxide film 31 is formed in the exposed surface of SOI layer 3 by thermal oxidation process. As a result, the thickness of SOI layer 3 under trench 21 for isolation is set to about 30 nm. On this occasion, since inner wall oxide film 31 which is a thermal oxidation film is formed so that the edge part of SOI layer 3 is covered including the bottom of sidewall 19, the thickness near the edge part of SOI layer 3 of inner wall oxide film 31 becomes thicker than another regions while the edge part of SOI layer 3 is rounded. The thickness of inner wall oxide film 31 of the edge part of SOI layer 3 is formed more thickly than the thickness of inner wall oxide film 17 of Embodiment 7 by the effect of residual exposed surface oxidation region 18a. Sidewall 20 is removed by the pullback phenomenon.

Figure 40:
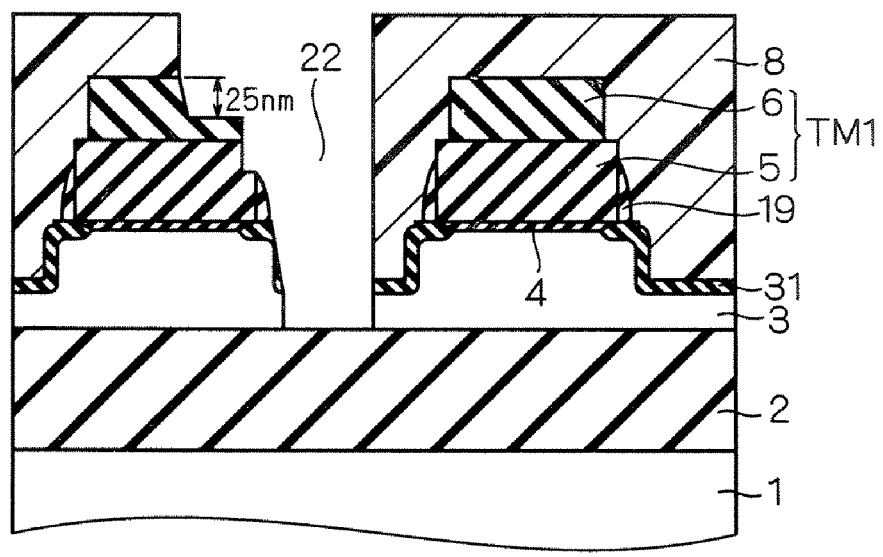

Then, as shown in FIG. 40, etching to inner wall oxide film 31 and SOI layer 3 is performed by using resist 8 patterned and trench mask TM1 as a mask, and trench 22 for full isolation to which the surface of embedded insulating layer 2 was exposed is formed. At this time, although a part of CVD oxide films 6 on which resist 8 is not formed in the upper part is removed (removed by depth of about 25 nm in the example of FIG. 40), since silicon nitride film 5 under CVD oxide film 6 is not removed, the thickness of silicon nitride film 5 is kept constant.

Then, as shown in FIG. 41, like Embodiment 1 etc., resist 8 is removed, CMP treatment is performed, and flattening of the isolation oxide film 9 is made. Since the thickness of silicon nitride film 5 is kept uniform at this time, it works effectively as a polishing stopper.

Then, as shown in FIG. 42, after performing oxide film etching by fluoric acid for adjusting the level difference of isolation oxide film 9 and the surface of SOI layer 3, as a result of removing silicon nitride film 5, the insulated isolation structure of partial and full isolation combined use is acquired. As a result, the thickness of isolation oxide film 9 in partial isolation region 41 and full isolation region 42 is kept uniform like Embodiment 1, respectively. Residual oxide film 31a remains under the bottom face of isolation oxide film 9 in partial isolation region 41, and between isolation oxide film 9 and SOI layer 3 in partial isolation region 41 and full isolation region 42. This residual oxide film 31a remains by thick thickness in the edge part of SOI layer 3.

Effect of Embodiment 8

According to the manufacturing method of the semiconductor device of Embodiment 8, since the thickness of silicon nitride film 5 is uniform even after the formation of trench 22 for full isolation as well as Embodiment 1-Embodiment 7, the variation in the transistor characteristics at the time of forming a transistor in SOI layer 3 can be decreased substantially.

The thickness of inner wall oxide film 31 of the edge part of SOI layer 3 is formed more thickly than the thickness of inner wall oxide film 17 of Embodiment 7 by the effect of residual exposed surface oxidation region 18a. As a result, in the SOI layer end portion neighboring region between SOI layer 3 and isolation oxide film 9, since residual oxide film 31a remains by thickness thicker than another regions exceeding the formation height of SOI layer 3, the exposure state in the edge part of SOI layer 3 is improved more than Embodiment 1 and Embodiment 7. As a result, when a transistor is formed in SOI layer 3, while obtaining the transistor of better transistor characteristics, the effect that the lowering of threshold voltage by the parasitic MOSFET phenomenon mentioned above can be suppressed more effectively is done so.

In Embodiment 8, although the top layer of trench mask TM1 was formed with CVD oxide film 6, even if it uses a polysilicon layer instead, the same effect is obtained.

What is claimed is:

1. A manufacturing method of a semiconductor device, comprising the steps of:
   a forming first, second and third layers over an SOI layer of an SOI substrate which includes a laminated structure of a semiconductor substrate, an embedded insulating layer, and the SOI layer, with the third layer on the SOI layer, the first layer on the third layer, and the second layer formed over the first layer, and simultaneously patterning the first layer and the second layer;
   (b) forming a first trench of a predetermined number by removing a part of upper layer portions of the SOI layer exposed from the second layer as patterned, the first trench of the predetermined number leaving lower layer portions of the SOI layer under the part of upper layer portions of the SOI layer as removed;
   (c) forming at least one second trench that reaches the embedded insulating layer by removing a part of the second layer exposed from a patterned resist and the SOI layer of lower part of at least one of the first trenches of the predetermined number, including
      forming a second insulating layer in a bottom face and a side face of the first trench, and a side face of the third layer by thermal oxidation process; and
      forming the second trench by removing the second insulating layer and the SOI layer exposed from the patterned resist;
   (d) performing CMP treatment until reaching the first layer after embedding an insulating layer for isolation in the first and the second trench after removing the resist; and
   (e) removing the third layer collectively at a time of removal of the first layer.

2. A manufacturing method of a semiconductor device according to claim 1, wherein the step (b) comprises the steps of:

(b-1) performing wet etching of the first insulating layer exposed from the second layer as pattered selectively; and (b-2) forming the first trench by removing an upper layer portion of the SOI layer exposed from the second layer as patterned.

3. A manufacturing method of a semiconductor device according to claim 1, wherein The step (a) comprises the step of forming a first insulating layer on the SOI layer, and forming the first layer on the first insulating layer.

4. A manufacturing method of a semiconductor device according to claim 1, wherein The step (a) comprises the steps of forming a first insulating layer on the SOI layer, and forming the third layer on the first insulating layer.

5. A manufacturing method of a semiconductor device according to claim 1, wherein the first layer is composed of a silicon nitride film, and the second layer is composed of a silicon oxide layer.

6. A manufacturing method of a semiconductor device according to claim 1, wherein the third layer is composed of a polysilicon layer.

* * * * *